United States Patent
Matsuu et al.

(10) Patent No.: US 8,374,205 B2
(45) Date of Patent: Feb. 12, 2013

(54) VERTICAL CAVITY SURFACE EMITTING LASER AND IMAGE FORMING APPARATUS

(75) Inventors: Toshimitsu Matsuu, Tokyo (JP); Takeshi Uchida, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/279,680

(22) Filed: Oct. 24, 2011

(65) Prior Publication Data

US 2012/0106587 A1 May 3, 2012

(30) Foreign Application Priority Data

Nov. 2, 2010 (JP) ................................ 2010-246317

(51) Int. Cl.
*H01S 3/098* (2006.01)
(52) U.S. Cl. ............................ 372/19; 372/107; 372/92
(58) Field of Classification Search .................... 372/19, 372/107, 92
See application file for complete search history.

(56) References Cited

U.S. PATENT DOCUMENTS

| | | | |
|---|---|---|---|
| 5,305,335 A * | 4/1994 | Ball et al. ........................... 372/6 |
| 5,621,750 A * | 4/1997 | Iwano et al. ...................... 372/96 |
| 7,539,226 B2 | 5/2009 | Uchida ....................... 372/43.01 |
| 7,680,168 B2 | 3/2010 | Uchida ....................... 372/43.01 |
| 7,688,875 B2 | 3/2010 | Uchida ....................... 372/50.12 |
| 7,796,662 B2 | 9/2010 | Uchida et al. ............. 372/46.013 |
| 7,796,668 B2 | 9/2010 | Hori et al. ................. 372/50.124 |
| 7,807,485 B2 | 10/2010 | Uchida et al. ..................... 438/29 |
| 7,830,944 B2 | 11/2010 | Takeuchi et al. ................. 372/99 |
| 7,839,912 B2 | 11/2010 | Uchida .................... 372/50.124 |
| 7,839,913 B2 | 11/2010 | Uchida et al. ............ 372/50.124 |
| 7,842,530 B2 | 11/2010 | Uchida ........................... 438/39 |
| 7,869,483 B2 | 1/2011 | Uchida et al. .................... 372/99 |
| 8,149,892 B2 | 4/2012 | Nagatomo et al. .............. 372/99 |
| 2007/0153867 A1 | 7/2007 | Muller ..................... 372/50.124 |
| 2011/0158280 A1 | 6/2011 | Nagatomo et al. ........... 372/50.1 |
| 2011/0216796 A1 | 9/2011 | Nagatomo et al. ......... 372/45.01 |

FOREIGN PATENT DOCUMENTS

| | | |
|---|---|---|
| JP | H08-236868 | 9/1996 |
| JP | 2007-158347 | 6/2007 |
| JP | 2009-147302 | 7/2009 |

OTHER PUBLICATIONS

H. J. Unold et al., "Improving Single-Mode VCSEL Performance by Introducing a Long Monolithic Cavity", *IEEE Photonics Technology Letters*, vol. 12, No. 8, Aug. 2000, p. 939-941.
S. W. Corzine et al., *Photo. Tech. Lett.*, vol. 1, No. 3, 1989, p. 52-54.
J. A. Lott et al., *Appl. Phys. Lett.*, vol. 63, No. 25, Dec. 20, 1993, p. 3485-3487.

* cited by examiner

*Primary Examiner* — Kinam Park
(74) *Attorney, Agent, or Firm* — Fitzpatrick, Cella, Harper & Scinto

(57) ABSTRACT

Provided is a vertical cavity surface emitting laser that includes a plurality of laminated semiconductor layers including an active layer and that oscillates at a wavelength λ1, wherein a resonator is formed by upper and lower multilayer reflecting mirrors has a structure that generates a longitudinal multimode, and the first active layer is arranged at a position shifted from a standing wave loop of the first longitudinal mode. According to the vertical cavity surface emitting laser capable of suppressing oscillation of the second longitudinal mode with a large gain and capable of single longitudinal mode oscillation based on the first longitudinal mode, the longitudinal mode spacing is narrowed by increasing the length of the resonator for single transverse mode oscillation at a high output, and the single longitudinal mode oscillation is possible even if longitudinal multimode oscillation occurs.

15 Claims, 10 Drawing Sheets

VERTICAL CAVITY SURFACE EMITTING LASER AND IMAGE FORMING APPARATUS

BACKGROUND OF THE INVENTION

1. Field of the Invention

The present invention relates to a vertical cavity surface emitting laser and an image forming apparatus using the vertical cavity surface emitting laser.

2. Description of the Related Art

A vertical cavity surface emitting laser (VCSEL) can extract light in a vertical direction relative to a semiconductor substrate. Therefore, a two-dimensional array can be easily formed with VCSELs.

Various industrial applications of a surface-emitting laser array are expected, and for example, if a high-density two-dimensional laser array is used, applications to a high-speed high-definition electrophotographic system are possible. In an electrophotographic process, since stable and minute laser spots need to be formed on a photoconductor drum, a stable operation of a single transverse mode and a single longitudinal mode is necessary as a laser characteristic. By using the surface-emitting laser, a current confinement layer can be provided by selective oxidation in an element to limit a light emission area of an active layer, which realizes single transverse mode formation. However, if single transverse mode oscillation is attempted based only on this method, the oxide confinement diameter needs to be reduced to about 3 μm, which reduced oxide confinement diameter derives a reduced light emission area and thus it is difficult to obtain a large laser output.

Japanese Patent Application Laid-Open No. 2009-147302 proposes a surface-emitting laser as a method for single transverse mode formation under a larger oxide confinement diameter, the surface-emitting laser attains a single transverse mode oscillation at a high output by elongating a resonator to enlarge a diffraction loss of a higher-order transverse mode compared to a diffraction loss of a basic transverse mode.

The optical layer thickness of a resonator often used in a general surface-emitting laser is about one wavelength or two wavelengths. For example, the physical length of resonator in one-wavelength resonator is conventionally about 0.3 μm in a laser of a 980 nm band used in H. J. Unold et al., IEEE Photonics Technology Letters, Vol. 12, No. 8, August 2000, p. 939-941. Meanwhile, in Unold et al., a spacer layer of 2 to 8 μm is provided in the resonator to increase the resonator length to attain the single transverse mode oscillation with a current confinement layer having an oxide confinement diameter of 7 μm.

S. W. Corzine et al., Photo. Tech. Lett., Vol. 1, No. 3, 1989, p. 52-54 illustrates reducing a threshold current and improving the efficiency by positioning an active layer at a standing wave loop to increase the gain of the active layer.

SUMMARY OF THE INVENTION

However, longitudinal multimode oscillation and longitudinal mode hopping may occur by elongating the resonator to realize the single transverse mode oscillation at a high output in the surface-emitting laser of Japanese Patent Application Laid-Open No. 2009-147302. This may not be satisfactory in attaining a stable operation of the single longitudinal mode.

In a normal surface-emitting laser of one-wavelength resonator, since the longitudinal mode spacing is large (50 nm or more), the single longitudinal mode oscillation is attained. However, if the resonator length is increased by providing a spacer layer of 2 to 8 μm in the resonator as in Unold et al. described above, the longitudinal mode spacing is reduced to about 10 nm. Since the longitudinal mode spacing is reduced as such, a gain spectrum 1510 and a resonant wavelength of a plurality of longitudinal modes 1520, 1530, and 1540 overlap as illustrated in FIG. 13. Therefore, longitudinal multimode oscillation or longitudinal mode hopping may occur.

In view of the foregoing problems, an object of the present invention is to provide a vertical cavity surface emitting laser capable of stable single longitudinal mode oscillation even if longitudinal multimode oscillation or longitudinal mode hopping occurs as a result of narrowing of the longitudinal mode spacing by increasing the length of the resonator for the single transverse mode oscillation at a high output.

Another object is to provide an image forming apparatus using the vertical cavity surface emitting laser. The present invention provides a vertical cavity surface emitting laser that includes a plurality of semiconductor layers laminated on a substrate, the layers including a lower multilayer reflecting mirror, an upper multilayer reflecting mirror, and a first active layer arranged between the mirrors, and that oscillates at a wavelength $\lambda 1$, in which a resonator is formed by the upper multilayer reflecting mirror and the lower multilayer reflecting mirror, the resonator has a structure that generates a longitudinal multimode including: a first longitudinal mode in which a resonant wavelength is $\lambda 1$, and in which a confinement factor of the first active layer is $\Gamma 1$ and a gain at the resonant wavelength $\lambda 1$ in a gain spectrum originated from the first active layer is $g1$ ($g1 \neq 0$); a second longitudinal mode in which the resonant wavelength is $\lambda 2$ and which is adjacent to the first longitudinal mode, and in which the confinement factor is $\Gamma 2$ and the gain at the resonant wavelength $\lambda 2$ is $g2$ ($g2 \neq 0$); and a third longitudinal mode that is different from the second longitudinal mode in which the resonant wavelength is $\lambda 3$ and which is adjacent to the first longitudinal mode, and in which the confinement factor is $\Gamma 3$ and the gain at the resonant wavelength $\lambda 3$ is $g3$ ($g2 > g3$), and the first active layer is arranged at a position shifted from a standing wave loop of the first longitudinal mode formed in the resonator, oscillation of the second longitudinal mode with a large gain of the first active layer among the first to third longitudinal modes is suppressed, and single longitudinal mode oscillation based on the first longitudinal mode is allowed.

The present invention provides an image forming apparatus including: the vertical cavity surface emitting laser; and a light deflector that reflects a laser beam output from the vertical cavity surface emitting laser for scanning.

The present invention can realize a vertical cavity surface emitting laser capable of stable single longitudinal mode oscillation even if longitudinal multimode oscillation or longitudinal mode hopping occurs as a result of narrowing of the longitudinal mode spacing by increasing the length of the resonator for the single transverse mode oscillation at a high output.

The present invention can also realize an image forming apparatus using the vertical cavity surface emitting laser.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

The present invention allows stable single longitudinal mode oscillation by providing a configuration of the following surface-emitting laser for a structure in which longitudinal multimode and longitudinal mode hopping may occur by increasing the length of the resonator for single transverse mode oscillation at a high output.

More specifically, a position of an active layer that is conventionally placed at a standing wave loop of a first longitudinal mode is shifted from the standing wave loop. As a result, in a vertical cavity surface emitting laser that oscillates at a wavelength $\lambda 1$, oscillation of a second longitudinal mode with a large gain of active layer, among second and third longitudinal modes adjacent to the first longitudinal mode with resonant wavelength $\lambda 1$, can be suppressed, and single longitudinal mode oscillation can be obtained.

The position of the active layer is at the center of a layer that generates inductive amplification, and if there is a plurality of centers, the position of the active layer is at the center of gravity of the centers. For example, the position of active layer is at the center of the active layer in the case of a bulk active layer and is at a position of the center of gravity of quantum wells in the case of a plurality of quantum wells or quantum dots.

Embodiments of the present invention will now be described with reference to FIG. 1.

Figure 1:
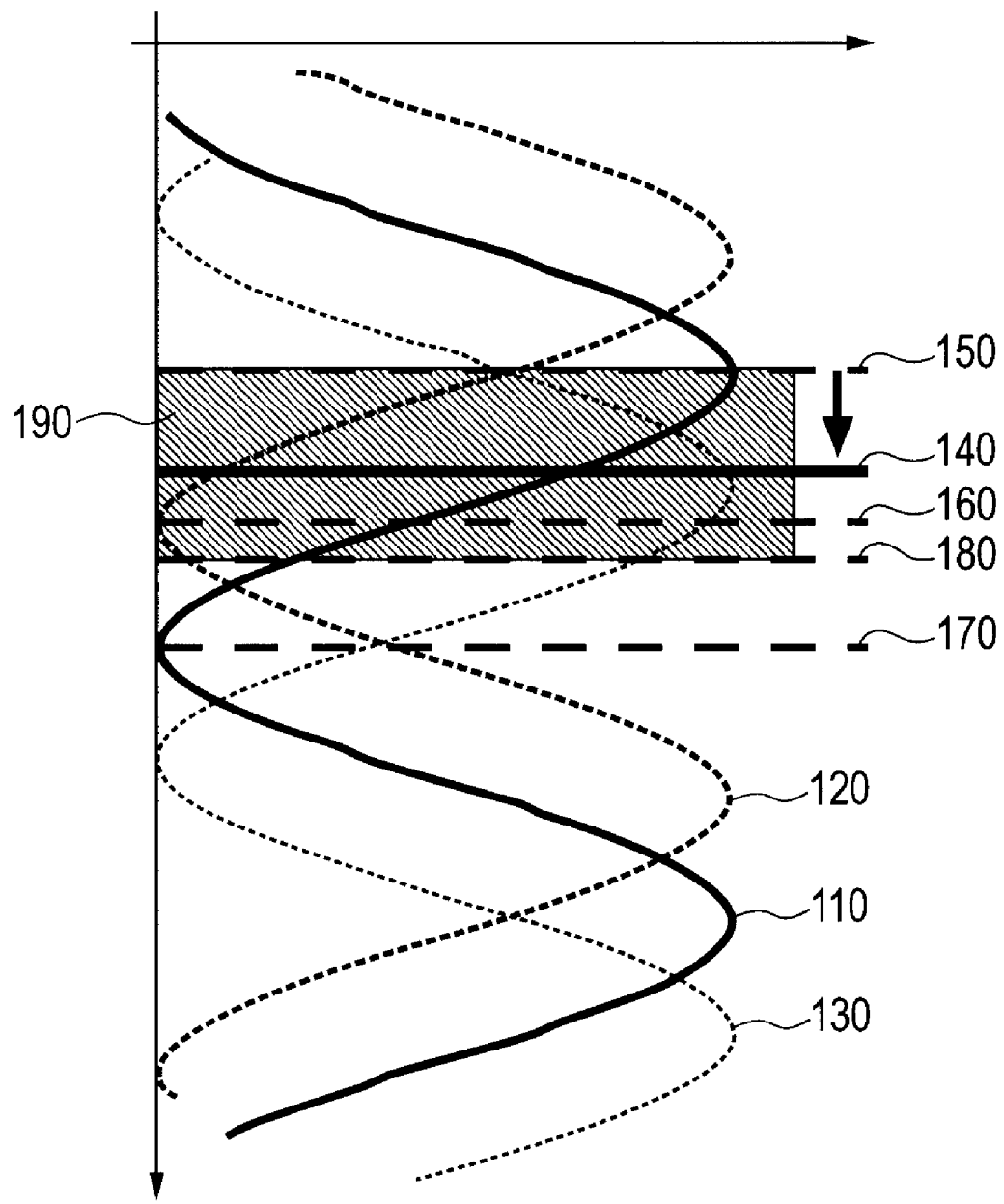
FIG. 1 is a diagram describing a relationship between an intensity distribution of standing waves of longitudinal modes and a position of active layer of a surface-emitting laser according to embodiments of the present invention.

FIG. 1 is a diagram showing an intensity distribution of standing waves of longitudinal modes and a position of active layer according to the embodiments. FIG. 1 illustrates a first longitudinal mode 110, a second longitudinal mode 120, and a third longitudinal mode 130. FIG. 1 further illustrates an active layer 140, a position A 150, a position B 160, a position C 170, and a position D 180.

In the first longitudinal mode 110, the second longitudinal mode 120, and the third longitudinal mode 130, resonant wavelengths are $\lambda 1$, $\lambda 2$, and $\lambda 3$, gains of active layer are g1, g2, and g3, and confinement factors to active layer determined by standing waves are $\Gamma 1$, $\Gamma 2$, and $\Gamma 3$, respectively. In the second longitudinal mode 120 and the third longitudinal mode 130, g2>g3.

The gain g of active layer denotes a gain at each resonant wavelength in a gain spectrum originated from the active layer.

The confinement factor $\Gamma$ determined by the standing waves denotes a ratio of light confined to the active layer determined by the intensity distribution of the standing waves formed in a resonator including upper and lower multilayer reflecting mirrors and determined by the active layer structure and the position of active layer.

Values of g and $\Gamma$ described below are standardized so that the peak values are 1.

As shown in FIG. 1, the active layer 140 is between the position A 150 as a standing wave loop of the first longitudinal mode 110 and the position D 180 that is a position where $\Gamma 1/\Gamma 2$ is equal to $\Gamma 1/\Gamma 2$ at the position A. The distance from the position D 180 to the position A 150 is shorter than the distance from the position C 170 to the position A 150. The position C 170 is at a node closest to the position B 160, which is at a node of the second longitudinal mode 120 closest from the position A 150, among the nodes of the standing wave of the first longitudinal mode.

Between the position A 150 and the position D, $\Gamma 1/\Gamma 2$ is greater than when the active layer 140 is placed at the position A 150. Therefore, oscillation of the second longitudinal mode 120 can be suppressed.

Single longitudinal mode oscillation is possible by placing the active layer 140 between the position A 150 and the position D 180 and within a shaded range 190 of FIG. 1 in which the first longitudinal mode is greater than the second and third longitudinal modes, in relation to the longitudinal modes obtained by products of $\Gamma$ and g. More specifically, the oscillation of the second longitudinal mode 120 can be suppressed and the single longitudinal mode oscillation of the first longitudinal mode 110 is possible by placing the active layer 140 within a range satisfying $\lambda 1g1>\lambda 2g2$ and $\Gamma 1g1>\Gamma 3g3$ which is the shaded range 190 of FIG. 1

A highly reliable image forming apparatus can be realized by applying the vertical cavity surface emitting laser of the present invention to an image forming apparatus including a photoreceptor that forms an electrostatic latent image based on light deflected by a light deflector that reflects a laser beam for scanning.

First to third embodiments of the present invention will now be described.

First Embodiment

An example of configuration of the vertical cavity surface emitting laser applying the present invention will be described as the first embodiment with reference to FIG. 4.

Figure 4:
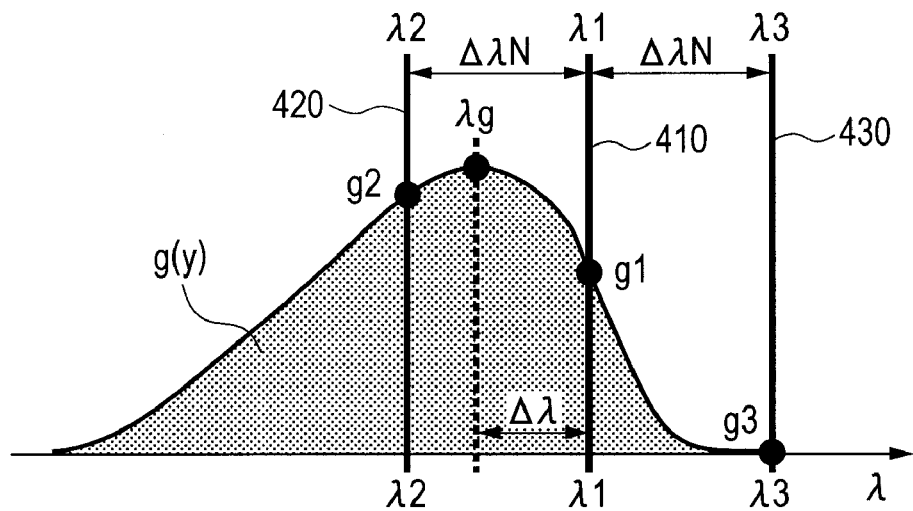
FIG. 4 is a diagram describing a relationship between longitudinal modes and a gain spectrum of the surface-emitting laser according to the first embodiment of the present invention.

FIG. 4 illustrates a relationship between longitudinal modes and a gain spectrum of the vertical cavity surface emitting laser (hereinafter, "surface-emitting laser") according to the present embodiment. The relationship between a resonant wavelength $\lambda 1$ of a first longitudinal mode 410 and a resonant wavelength $\lambda 2$ of a second longitudinal mode 420 is $\lambda 2 < \lambda 1$. Although $g3=0$ in FIG. 4, it is only necessary to satisfy $\lambda 2 < \lambda 1$, $g1 \neq 0$, and $g2 \neq 0$.

The active layer has a gain spectrum, in which the wave is generated at the wavelength $\lambda 1$, and the difference between the wavelength $\lambda 1$ and a peak wavelength $\lambda g$ of the gain spectrum determined by the active layer is an amount of detuning $\Delta\lambda(=\lambda 1-\lambda g)$. The gain spectrum is expressed by a function $g(y)$.

The present embodiment has a resonator structure in which the first longitudinal mode 410, the second longitudinal mode 420, and the third longitudinal mode 430 have longitudinal mode spacing $\Delta\lambda N$, and a resonator length is $M \times \lambda 1$. In this case, the relationship between $\Delta\lambda$, $\Delta\lambda N$, and $g(y)$ satisfies $g1 \neq 0$, $g2 \neq 0$, and $g2 > g3$. When designed to satisfy $\lambda 2 < \lambda 1$, the gain spectrum is displaced toward the long wavelength side when the temperature of the active layer increases due to self-heating or environmental temperature, and $\lambda 1$ can obtain a large gain.

The suppression of the oscillation of the second longitudinal mode and for the single longitudinal mode oscillation of the first longitudinal mode is enabled when the active layer is placed at a position between the position A and the position D and within a range in which the first longitudinal mode is greater than the second and third longitudinal modes in relation to the longitudinal modes which are products of $\Gamma$ and g. More specifically, the position satisfies $\Gamma 1(0)/\Gamma 2(0) < \Gamma 1(x')/\Gamma 2(x')$, $\Gamma 1 g1 > \Gamma 2 g2$, and $\Gamma 1 g1 > \Gamma 3 g3$.

In this case, $\Gamma 1$ denotes a function of a distance x in which the substrate direction is positive based on an effective resonator edge of an upper multilayer reflecting mirror after taking into consideration the light penetration of the upper multilayer reflecting mirror. Furthermore, $\Gamma 1(x')$ denotes a function of a distance x' in which the number of standing wave loops from an effective resonator edge of the upper multilayer reflecting mirror is N', and the substrate direction is set positive based on the position of the N'-th standing wave loop. The following formula is formed.

$$x = x' + \left(N' - \frac{1}{2}\right) \times \frac{\lambda 1}{2n}$$

In the formula, n denotes an effective refractive index.

Since g1, g2, g3, $\Gamma 1$, $\Gamma 2$, $\Gamma 3$, $\Gamma 1(x')$, and $\Gamma 2(x')$ can be expressed by using $\lambda 1$, $\Delta\lambda$, $\Delta\lambda N$, and $g(y)$, the relationship can be expressed by the following Expressions 1, 2, and 3. Based on $\lambda 2 < \lambda 1$, $\lambda 2 = \lambda - \Delta\lambda N$ and $\lambda 3 = \lambda 1 + \Delta\lambda N$.

The suppression of the oscillation of the second longitudinal mode and the single longitudinal mode oscillation of the first longitudinal mode are possible by placing the active layer at a position satisfying the following Expressions 1 to 3.

$$\frac{g1}{g2} = \frac{g(\Delta\lambda)}{g(\Delta\lambda - \Delta\lambda N)} > \frac{\sin^2\left(\frac{2\pi}{(\lambda 1 - \Delta\lambda N)}x\right)}{\sin^2\left(\frac{2\pi}{\frac{\lambda 1}{n}}x\right)} = \frac{\Gamma 2}{\Gamma 1} \quad [\text{Expression 1}]$$

$$\frac{g1}{g3} = \frac{g(\Delta\lambda)}{g(\Delta\lambda + \Delta\lambda N)} > \frac{\sin^2\left(\frac{2\pi}{(\lambda 1 + \Delta\lambda N)}x\right)}{\sin^2\left(\frac{2\pi}{\frac{\lambda 1}{n}}x\right)} = \frac{\Gamma 3}{\Gamma 1} \quad [\text{Expression 2}]$$

$$\frac{\Gamma 1(0)}{\Gamma 2(0)} = \frac{\sin^2\left[\frac{2\pi}{(\lambda 1)}\left\{\left(N' - \frac{1}{2}\right) \times \frac{\lambda 1}{2n}\right\}\right]}{\sin^2\left[\frac{2\pi}{(\lambda 1 - \Delta\lambda N)}\left\{\left(N' - \frac{1}{2}\right) \times \frac{\lambda 1}{2n}\right\}\right]} < \quad [\text{Expression 3}]$$

$$\frac{\sin^2\left[\frac{2\pi}{(\lambda 1)}\left\{x' + \left(N' - \frac{1}{2}\right) \times \frac{\lambda 1}{2n}\right\}\right]}{\sin^2\left[\frac{2\pi}{(\lambda 1 - \Delta\lambda N)}\left\{x' + \left(N' - \frac{1}{2}\right) \times \frac{\lambda 1}{2n}\right\}\right]} = \frac{\Gamma 1(x')}{\Gamma 2(x')}$$

Figure 5:
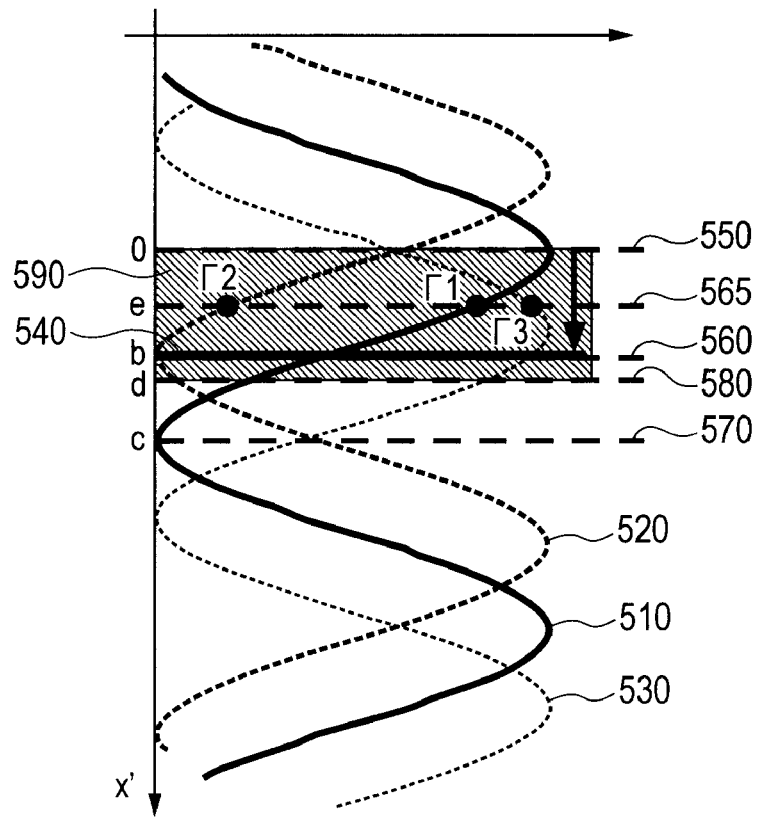
FIG. 5 is a diagram describing a relationship between an intensity distribution of standing waves of longitudinal modes and a position of active layer of the surface-emitting laser according to the first embodiment of the present invention.

FIG. 5 illustrates an intensity distribution of standing waves of longitudinal modes and a position of active layer to describe the range of the position of active layer satisfying Expressions 1 to 3.

In this case, $\lambda 2 < \lambda 1$, and in the same way as Unold et al., the spacer layer is positioned between an n-type lower multilayer reflecting mirror and the active layer. Therefore, the relationship between a first longitudinal mode 510, a second longitudinal mode 520, and a third longitudinal mode 530 is as illustrated in FIG. 5.

In FIG. 5, a position A 550 as a position of an N'-th standing wave loop of the first longitudinal mode 510 is x'=0. In FIG. 5, x' is a position of the active layer in which the direction of a substrate 310 is a positive direction based on the position A 550. In this case, N' is N'<N/2 when the number of standing waves is N.

A position C 570 is at a node closest to a position B 560 which is a node of the second longitudinal mode 520 closest from the position A, among the nodes of the standing wave of the first longitudinal mode 510.

A position between the position A and the position C and in which the left-hand side and the right-hand side of Expression 3 are equal, i.e. a position where $\Gamma 1/\Gamma 2$ is equal to $\Gamma 1/\Gamma 2$ of the position A is a position D 580.

The center between the position A and the position B is a position E 565.

When the layer configuration is determined and $\lambda 1$, $\Delta\lambda$, $\Delta\lambda N$, and N' are defined, the positions x' are determined as follows.

The position A 550 is x'=0.

The position B 560 is x'=b, and b is as in the following formula.

$$b = \frac{\lambda 1 - \Delta\lambda N}{2n} \times N' - \frac{\lambda 1}{2n} \times \left(N' - \frac{1}{2}\right)$$

The position C 570 is x'=c, and c=$\lambda 1/4n$.

The position D 580 is x'=d, and d satisfies the following formula.

$$\frac{\sin^2\left[\frac{\frac{2\pi}{(\lambda 1)}\left\{d+\left(N'-\frac{1}{2}\right)\times\frac{\lambda 1}{2n}\right\}}{n}\right]}{\sin^2\left[\frac{\frac{2\pi}{(\lambda 1-\Delta\lambda N)}\left\{d+\left(N'-\frac{1}{2}\right)\times\frac{\lambda 1}{2n}\right\}}{n}\right]} =$$

$$\frac{\sin^2\left[\frac{\frac{2\pi}{(\lambda 1)}\left\{\left(N'-\frac{1}{2}\right)\times\frac{\lambda 1}{2n}\right\}}{n}\right]}{\sin^2\left[\frac{\frac{2\pi}{(\lambda 1-\Delta\lambda N)}\left\{\left(N'-\frac{1}{2}\right)\times\frac{\lambda 1}{2n}\right\}}{n}\right]}$$

The position E 565 is x'=e, and e=b/2.

The suppression of the oscillation of the second longitudinal mode and the single longitudinal oscillation of the first longitudinal mode are possible by placing an active layer 540 between the position A 550 and the position D 580. The effect can be improved by placing the active layer 540 between the position A 550 and the position B 560. The effect can be further improved by placing the active layer 540 between the position E 565 and the position B 560.

Figure 6:
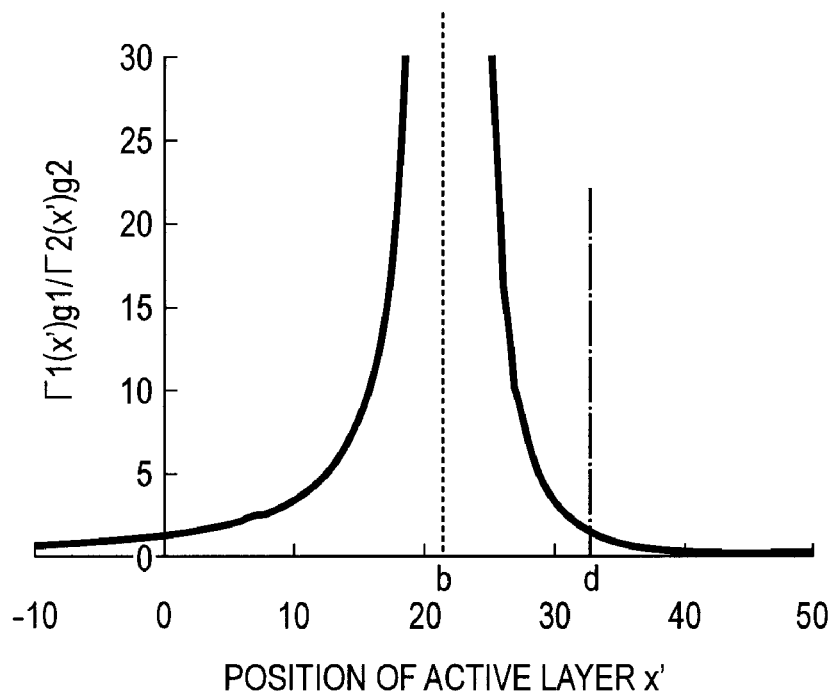
FIG. 6 is a diagram describing a relationship between a position of active layer x' and $\Gamma 1(x')g1/\Gamma 2(x')g2$ of the surface-emitting laser according to the first embodiment of the present invention.

To illustrate the effect, FIG. 6 shows relationship between the position x' and Γ1(x')g1/Γ2(x')g2. In this case, the following specific values are used for λ1, Δλ, ΔλN, g(y), and N'.

More specifically, λ1=680 nm, Δλ=5 nm, ΔλN=14 nm, and N'=14 are used as values in which λ1, Δλ, ΔλN, g(y), and N' satisfy λ1<λ2, g1≠0, and g2≠0.

$$g(y) = -1.82*10^{-4}y^4 - 5.70*10^{-4}y^3 - 7.88*10^{-3}y^2 + 9.52*10^{-4}y + 1 \quad \text{[Expression 4]}$$

In this case, g1=0.73, g2=0.65, and g3=0 when λ2<λ1. Therefore, g3=0 is also satisfied under the condition.

In Expression 4, g(y) is defined by applying a quartic function approximation to a gain spectrum shape of n=4×10$^{18}$ cm$^{-3}$ as an injected carrier density with reference to FIG. 5 of J. A. Lott et al., Appl. Phys. Lett., Vol. 63, No. 25, 20 Dec. 1993, p. 3485-3487 to set specific function of a gain spectrum of a red laser.

In this case, y=0 is set at a position where the peak wavelength λg of the gain spectrum is λg=0.

In the active layer of Lott et al., a GaInP quantum well layer of 10 nm is placed between barrier layers of AlGaInP.

The oscillation of the second longitudinal mode 520 can be suppressed by placing the active layer 540 between the position A 550 and the position D 580, i.e., at 0<x'<33.1 in FIG. 6.

The position of active layer with the maximum value of Γ1(x')g1/Γ2(x')g2 is the position B 560, i.e., x'=b, and in this case, b=21.8 nm.

The value of Γ1(x')g1/Γ2(x')g2 is a monotonic increase from the position A to the position B and is a monotonic decrease from the position B to the position D. Therefore, the effect can be further improved between the position E and the position B.

The maximum value of Γ1(x')g1/Γ2(x')g2 is the position B. Therefore, if the active layer 540 is placed at the position B when only the second longitudinal mode needs to be considered, the first longitudinal mode becomes stable, and the effect of single longitudinal mode formation is maximized.

For any range, Γ1g1>Γ2g2 and Γ1g1>Γ3g3, i.e. Expressions 1 and 2, need to be satisfied.

A layer configuration of the surface-emitting laser according to the present embodiment for obtaining the effect will be described with reference to FIG. 3. In the surface-emitting laser of the present embodiment, a lower multilayer reflecting mirror 320, a spacer layer 330, a lower clad layer 340, a first active layer 350 (hereinafter, "active layer 350"), an upper clad layer 360, and an upper multilayer reflecting mirror 370 are laminated on the substrate 310. The lower clad layer 340, the active layer 350, and the upper clad layer 360 are defined as a first area 380.

Low refractive index layers and high refractive index layers are alternately laminated in the lower multilayer reflecting mirror 320 and the upper multilayer reflecting mirror 370, and the optical thickness of each layer is λ/4 when the oscillation wavelength of the laser is λ.

Specific materials, layer configuration, and position of active layer of FIG. 3 for obtaining the effect will be illustrated below in relation to a red surface-emitting laser at a wavelength of 680 nm.

An n-type GaAs substrate is used for the substrate 310. The lower multilayer reflecting mirror 320 is formed by pairs of 60 layers of n-type AlAs/Al$_{0.5}$Ga$_{0.5}$As, and the upper multilayer reflecting mirror 370 is formed by pairs of 38 layers of p-type Al$_{0.9}$Ga$_{0.1}$As/Al$_{0.5}$Ga$_{0.5}$As. Each layer is laminated with an optical thickness of λ1/4. A multi-quantum well of Ga$_{0.43}$In$_{0.57}$P/Al$_{0.25}$Ga$_{0.25}$In$_{0.5}$P is used for the active layer 350. The number of quantum wells of the Ga$_{0.43}$In$_{0.57}$P/Al$_{0.25}$Ga$_{0.25}$In$_{0.5}$P multi-quantum well 350 is three, and the center of the quantum well in the middle of the three quantum wells is the position of the active layer. An n-type AlGaInP is used for the lower clad layer 340, and a p-type AlGaInP is used for the upper clad layer 360.

A layer configuration and a layer thickness when the active layer 540 is placed at the position B 560 in the layer configuration, i.e. a position that is shifted 21.8 nm toward the substrate from the standing wave loop of the first longitudinal mode 510, as a specific example of the position of the active layer 540, is as follows.

The AlGaInP upper clad layer 360 has a thickness of 67.6 nm. The active layer 350 is a multi-quantum well including, from the upper layer, AlGaInP (42 nm)/Ga$_{0.43}$In$_{0.57}$P (6.5 nm)/AlGaInP (5.5 nm)/Ga$_{0.43}$In$_{0.57}$P (6.5 nm)/AlGaInP (5.5 nm)/Ga$_{0.43}$In$_{0.57}$P (6.5 nm)/AlGaInP (42 nm). The AlGaInP lower clad layer 340 has a thickness of 24.0 nm.

The position at 3.25 nm of the second Ga$_{0.43}$In$_{0.57}$P layer from the top of the active layer 350 is the position of active layer.

If the active layer 540 is placed at the position A 550 of a standing wave loop of the first longitudinal mode as a conventional configuration, the AlGaInP upper clad layer 360 and the AlGaInP lower clad layer 340 with the layer configuration are 45.8 nm.

The active layer 540 is shifted by 21.8 nm from the position A 550 toward the substrate in the present embodiment. Therefore, the AlGaInP upper clad layer 360 has a thickness of 67.6 nm, and the AlGaInP lower clad layer 340 has a thickness of 24.0 nm.

An n-type Al$_{0.5}$Ga$_{0.5}$As layer is used for the spacer layer 330, and the layer thickness is 2.18 μm.

The resonator length placed between the upper and lower multilayer reflecting mirrors, i.e. the total thickness from the spacer layer 330 to the upper clad layer 360, is determined by an effective resonator length, λ1, ΔλN, and an effective refractive index n after taking into consideration an effective reflection mirror length that is a light penetration to the reflecting mirror in the upper and lower multilayer reflecting mirrors. In this case, the resonator length is 12λ when the effective reflecting mirror length is taken into consideration from ΔλN=14 nm. Therefore, the lower clad layer 340, the active layer 350, and the upper clad layer 360 are 1λ, and the spacer layer 330 is 11λ. N'=14 is determined from the effective reflecting mirror length, the upper clad layer 360, and the active layer 350.

The layer configuration satisfies Expression 4, λ1=680 nm, Δλ=5 nm, ΔλN=14 nm, and N'=14. Therefore, the position of the active layer 540 and the positions of FIG. 5 are determined as follows.

At the position A 550, x'=0 nm.
At the position B 560, b=21.8 nm.
At the position C 570, c=51.5 nm.
At the position D 580, d=33.1 nm.
At the position E 565, e=10.9 nm.

In the configuration, the oscillation of the second longitudinal mode 520 can be suppressed by positioning the active layer at 0<x'<33.1 as described above. The range also satisfies Expressions 1 and 2, and the single longitudinal mode oscillation of the first longitudinal mode can be realized.

The first longitudinal mode becomes stable and the effect of single longitudinal mode formation is maximized if the active layer is placed at the position B when g3=0 is satisfied or when g3 is so small that the third longitudinal mode does not have to be taken into account as in the present embodiment.

The position of the active layer 540 is placed at the position B 560 in this case. However, the value of Γ1 decreases from the position A 550 to the position C 570. Therefore, the active layer may be placed at the following position if the oscillation of the second longitudinal mode is sufficiently suppressed.

For example, the active layer may be placed at the position E 565, x'=10.9 nm here, or may be placed between the position E 565 and the position B 560.

Figure 2:
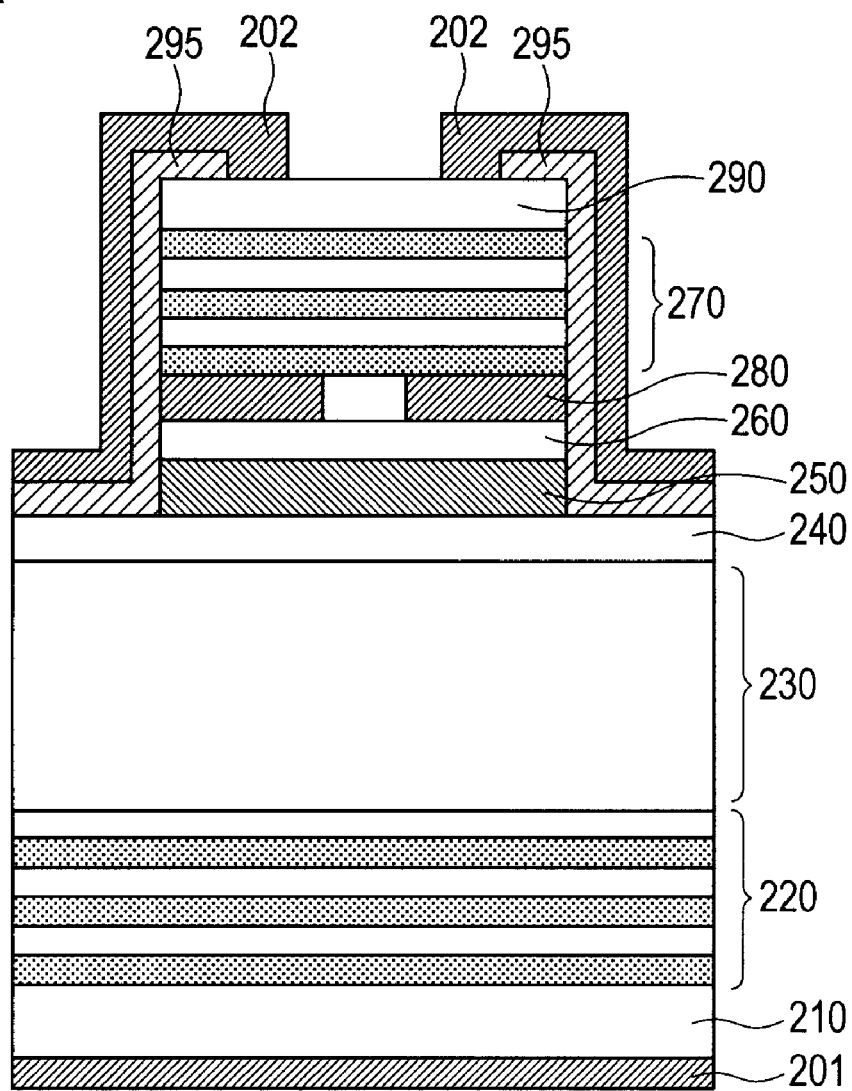
FIG. 2 is a cross-sectional schematic diagram describing an example of configuration of a surface-emitting laser based on a fabrication method of surface-emitting laser according to a first embodiment of the present invention.

An example of configuration of the surface-emitting laser based on a fabrication method of surface-emitting laser according to the first embodiment of the present invention will be described with reference to FIG. 2.

In the fabrication method of surface-emitting laser of the present embodiment, a lower multilayer reflecting mirror, an upper multilayer reflecting mirror, and a plurality of semiconductor layers including a first active layer arranged between the mirrors are laminated on a substrate as follows, thereby a vertical cavity surface emitting laser that oscillates at wavelength λ1 is created.

First, layers from a lower multilayer reflecting mirror 220 to a contact layer 290 are sequentially grown on a substrate 210. For example, the lower multilayer reflecting mirror 220, a spacer layer 230, a lower clad layer 240, an active layer 250, an upper clad layer 260, an upper multilayer reflecting mirror 270, and the contact layer 290 are grown based on an MOCVD (Metal Organic Chemical Vapor Deposition) method.

A mesa structure is then formed by removing up to above the lower clad layer 240 of the wafer based on a general semiconductor lithography method and semiconductor etching, dry etching here. The diameter of the mesa structure is, for example, 26 μm.

A current confinement unit 280 is formed by, for example, a selective oxidation method or proton implantation. In the formation of the current confinement unit 280 based on the selective oxidation method, for example, an AlAs layer and an $Al_{0.98}Ga_{0.02}As$ layer having high Al composition are arranged in the upper multilayer reflecting mirror 270, and selective oxidation is performed in a high temperature steam atmosphere to form a current confinement layer to allow injecting a current only to a necessary area. The current confinement diameter is, for example, 5 μm.

An insulation film 295 is deposited to cover the mesa structure, and part of the insulation film 295 over the mesa is removed. For example, a $SiO_2$ film is deposited as the insulation film 295 by, for example, a plasma CVD method. The insulation film 295 is removed by, for example, buffered hydrofluoric acid.

An upper electrode 202 and a lower electrode 201 are deposited using, for example, a vacuum evaporation method and a lithography method. The upper electrode 202 is, for example, Ti/Au, and the lower electrode 201 is, for example, AuGe/Au. GaAs is used for example as the contact layer 290 that touches the upper electrode 202.

An annealing process may be applied to a surface-emitting laser 200 at about 300° C. if necessary.

The formation methods, the semiconductor materials, the electrode materials, and the dielectric materials are not limited to the ones disclosed in the embodiments, and other methods and materials can be used within the scope of the present invention. For example, a p-type GaAs substrate may be used for the substrate 310. In that case, the lower multilayer reflecting mirror 320 is a p-type semiconductor, and the upper multilayer reflecting mirror 370 is an n-type semiconductor.

The numbers of pairs in the lower multilayer reflecting mirror 320 and the upper multilayer reflecting mirror 370 may be appropriately changed in accordance with a required reflectance.

Materials other than the materials described above may be used for the lower multilayer reflecting mirror 320 and the upper multilayer reflecting mirror 370 as long as high refractive index layers and low refractive index layers are appropriately arranged, and composition gradient layers may be arranged between the layers.

The spacer layer 330 is arranged between the active layer 350 and the lower multilayer reflecting mirror 320. However, the spacer layer 330 may be arranged between the active layer 350 and the upper multilayer reflecting mirror 370. The spacer layer 330 may be arranged between the active layer 350 and the lower multilayer reflecting mirror 320 and between the active layer 350 and the upper multilayer reflecting mirror 370.

The p-type multilayer reflecting mirror absorbs more light than the n-type multiplayer reflecting mirror due to doping. Therefore, it is desirable to arrange the spacer layer 330 closer to the n-type multilayer reflecting mirror with less light absorption. More specifically, if the lower multilayer reflecting mirror 320 is an n type as illustrated in FIG. 3, it is desirable to arrange the spacer layer 330 between the active layer 350 and the lower multilayer reflecting mirror 320.

In the spacer layer 330, $AlAs/Al_{0.5}Ga_{0.5}As$ may be laminated at an optical layer thickness of λ/2, as described in Japanese Patent Application Laid-Open No. 2009-147302. The layer thickness may be appropriately changed.

It is desirable that the layer thickness of the spacer layer 330 is greater than a thickness at which the resonator length including the spacer layer 330, the lower clad layer 340, the active layer 350, and the upper clad layer 360, placed between the lower multilayer reflecting mirror 320 and the upper multilayer reflecting mirror 370, is effective for the single transverse mode control. For example, the layer thickness can be 6λ or more, since the resonator length in Unold et al. described above is considered to be about 6λ, in which the desirable effect is obtained for the spacer layer of 2 μm.

The number of multi-quantum wells of $Ga_{0.43}In_{0.57}P/Al_{0.25}Ga_{0.25}In_{0.5}P$ may be one or four in the active layer, and the composition ratio is not limited to this. The active layer is not limited to the quantum well structure, and bulk materials and quantum dots may be used.

Furthermore, λ1, Δλ, and ΔλN may also be appropriately changed as long as λ2<λ1 is satisfied, and a layer structure corresponding to that may be used.

Although the number of active layers in the first area 380 is one here, a periodic gain structure with two or more active layers may be used. More specifically, a second active layer other than the first active layer may be arranged in the first area. The configuration of the second active layer may be the same as or different from the configuration of the first active layer. The first active layer and the second active layer do not denote individual multi-quantum wells in the active layers, but denote a mass of multi-quantum well structure. The active layers are separated by inter-active-layer spacer layers.

To form a mass of multi-quantum well structure, the quantum well spacing is reduced to make the quantum wells as close to the optimal values as possible. For example, the spacing is narrowed down to about 5 nm. Meanwhile, the layer thickness of the inter-active-layer spacer layer is, for example, about ½×λ to ⅛×λ considering the center of gravity of the quantum wells. In this way, an increase in the gain can be expected using the periodic gain structure.

Second Embodiment

An infrared surface-emitting laser of wavelength 780 nm will be described as a second embodiment.

Unlike the first embodiment, λ2>λ1, g1≠0, g2≠0, and g3≠0 are satisfied in the configuration of the present embodiment.

Although a specific layer configuration from the lower multilayer reflecting mirror to the upper multilayer reflecting mirror of the present embodiment is different from that of the first embodiment, the fabrication method and the basic layer configuration of the surface-emitting laser are the same as in the first embodiment. Therefore, the description of the fabrication method, the substrate, and the electrode, for example, will not be repeated.

Figure 7:
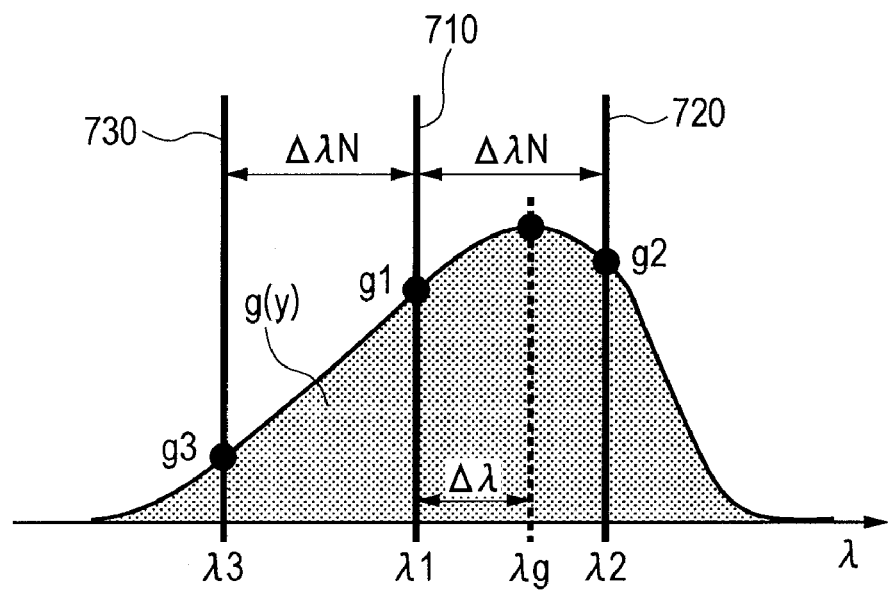
FIG. 7 is a diagram describing a relationship between longitudinal modes and a gain spectrum of a surface-emitting laser according to a second embodiment of the present invention.

FIG. 7 illustrates a relationship between longitudinal modes and a gain spectrum of the surface-emitting laser according to the present embodiment. FIG. 7 illustrates a relationship diagram between gains g1, g2, and g3 and Δλ, ΔλN, and g(y) of an active layer related to a first longitudinal mode 710, a second longitudinal mode 720, and a third longitudinal mode 730.

The relationship between a resonant wavelength λ1 of the first longitudinal mode 710 and a resonant wavelength λ2 of the second longitudinal mode is λ2>λ1. Although g2 is greater than g1 in FIG. 7, g2 may be smaller than g1. If designed to satisfy λ2>λ1, the gain of λ3 decreases when the temperature of the active layer increases and the gain spectrum is displaced toward the long wavelength due to self heating or environmental temperature, and a more stable state is set.

The suppression of the oscillation of the second longitudinal mode and the single longitudinal mode oscillation of the first longitudinal mode is enabled when the active layer is placed at a position satisfying Γ1(0)/Γ2(0)<Γ1(x')/Γ2(x'), Γ1g1>Γ2g2, and Γ1g1>Γ3g3 as in the first embodiment, i.e. the position satisfying the following Expressions 5, 6, and 7.

Unlike in the first embodiment, λ2 is greater than λ1, and therefore, λ2=λ1+ΔλN and λ3=λ1−ΔλN.

$$\frac{g1}{g2} = \frac{g(\Delta\lambda)}{g(\Delta\lambda + \Delta\lambda N)} > \frac{\sin^2\left(\frac{2\pi}{(\lambda1+\Delta\lambda N)}x\right)}{\sin^2\left(\frac{2\pi}{\frac{\lambda1}{n}}x\right)} = \frac{\Gamma 2}{\Gamma 1}$$ [Expression 5]

$$\frac{g1}{g3} = \frac{g(\Delta\lambda)}{g(\Delta\lambda - \Delta\lambda N)} > \frac{\sin^2\left(\frac{2\pi}{(\lambda1-\Delta\lambda N)}x\right)}{\sin^2\left(\frac{2\pi}{\frac{\lambda1}{n}}x\right)} = \frac{\Gamma 3}{\Gamma 1}$$ [Expression 6]

$$\frac{\Gamma 1(0)}{\Gamma 2(0)} = \frac{\sin^2\left[\frac{2\pi}{\frac{(\lambda1)}{n}}\left\{\left(N'-\frac{1}{2}\right)\times\frac{\lambda1}{2n}\right\}\right]}{\sin^2\left[\frac{2\pi}{\frac{(\lambda1+\Delta\lambda N)}{n}}\left\{\left(N'-\frac{1}{2}\right)\times\frac{\lambda1}{2n}\right\}\right]} <$$

$$\frac{\sin^2\left[\frac{2\pi}{\frac{(\lambda1)}{n}}\left\{x'+\left(N'-\frac{1}{2}\right)\times\frac{\lambda1}{2n}\right\}\right]}{\sin^2\left[\frac{2\pi}{\frac{(\lambda1+\Delta\lambda N)}{n}}\left\{x'+\left(N'-\frac{1}{2}\right)\times\frac{\lambda1}{2n}\right\}\right]} = \frac{\Gamma 1(x')}{\Gamma 2(x')}$$ [Expression 7]

Figure 8:
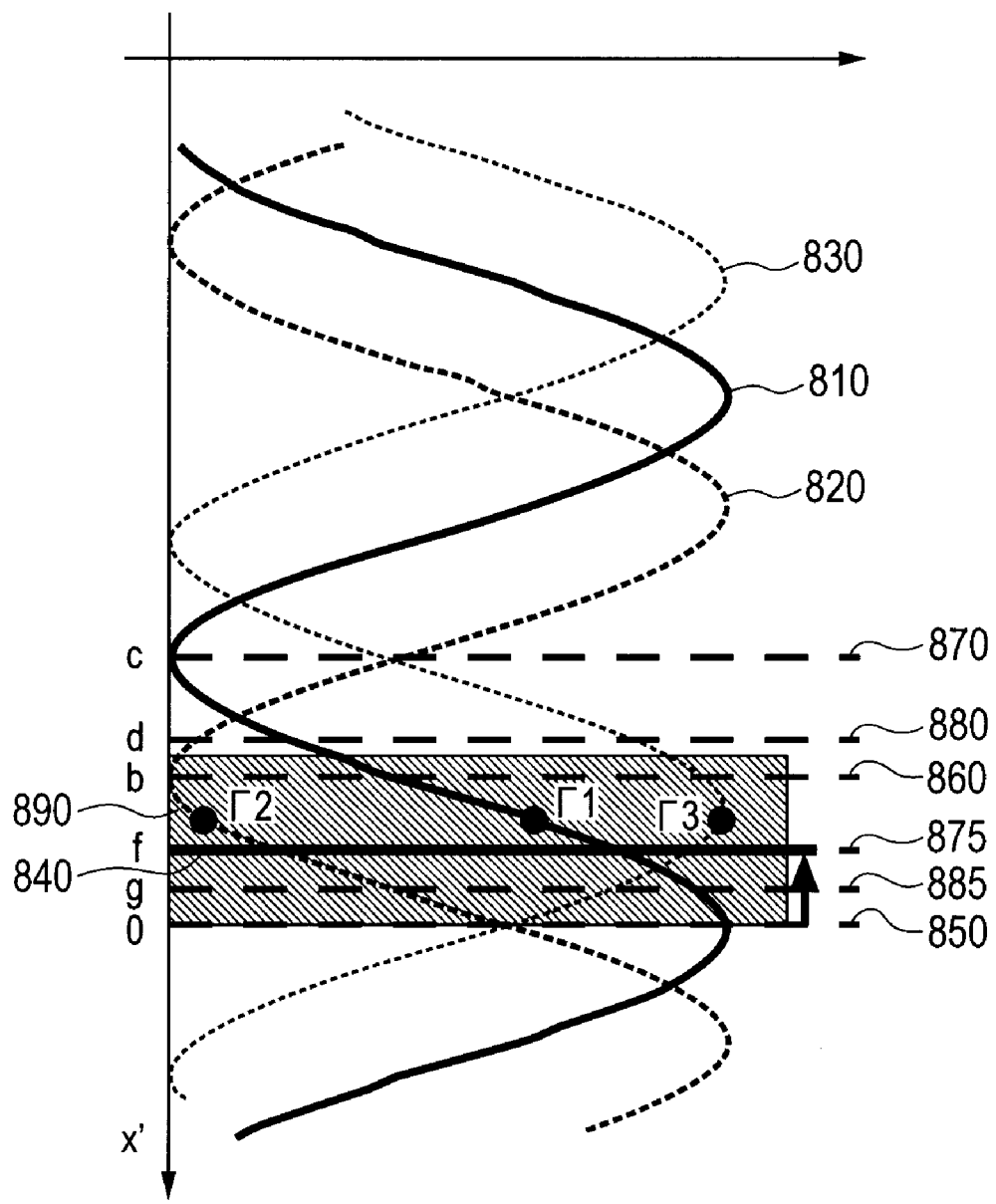
FIG. 8 is a diagram describing a relationship between an intensity distribution of standing waves of the longitudinal modes and a position of active layer of the surface-emitting laser according to the second embodiment of the present invention.

FIG. 8 illustrates an intensity distribution of standing waves of longitudinal modes and a position of active layer to describe the range of the position of active layer that satisfies Expressions 5 to 7.

In this case, λ2>λ1, and the spacer layer is positioned between the n-type lower multilayer reflecting mirror and the active layer as in Unold et al. Therefore, unlike in the first embodiment, the relationship between a first longitudinal mode 810, a second longitudinal mode 820, and a third longitudinal mode 830 is as in FIG. 8.

In FIG. 8, the position of the N'-th standing wave loop of the first longitudinal mode 810 is set as a position A 850, and x'=0 is set to the position A. In FIG. 8, x' is a position of the active layer when the direction of the substrate 310 based on the position A 850 is a positive direction.

A position C 870 is at a node closest to a position B 860 that is at a node of the second longitudinal mode 820 closest from the position A 850, among the nodes of the standing wave of the first longitudinal mode 810.

A position D 880 is at a position between the position A 850 and the position C 870 and where the left-hand side and the right-hand side of Expression 7 are equal, i.e. a position where Γ1/Γ2 is equal to Γ1/Γ2 of the position A 850. A position F 875 is a position between the position A 850 and the position B 860 and in which Γ2g2=Γ3g3. A position G 885 is at the center between the position A 850 and the position F 875.

When the layer configuration is determined and λ1, Δλ, ΔλN, and N' are defined, the positions x' are determined as follows.

At the position A 850, x'=0.

At the position B 860, x'=b, and b is as in the following formula.

$$b = \frac{\lambda1 + \Delta\lambda N}{2n} \times (N'-1) - \frac{\lambda1}{2n} \times \left(N'-\frac{1}{2}\right)$$

At the position C 870, x'=c, and c=−λ1/4n.

At the position F 875, x'=f, and f satisfies the following formula.

$$\frac{\Gamma 3}{\Gamma 2} = \frac{\sin^2\left[\frac{\frac{2\pi}{(\lambda 1 - \Delta \lambda N)}\left\{f + \left(N' - \frac{1}{2}\right) \times \frac{\lambda 1}{2n}\right\}}{n}\right]}{\sin^2\left[\frac{\frac{2\pi}{(\lambda 1 + \Delta \lambda N)}\left\{f + \left(N' - \frac{1}{2}\right) \times \frac{\lambda 1}{2n}\right\}}{n}\right]} = \frac{g(\Delta \lambda + \Delta \lambda N)}{g(\Delta \lambda - \Delta \lambda N)} = \frac{g2}{g3}$$

At the position G 885, x'=g, and g=f/2.

The suppression of the oscillation of the second longitudinal mode and the single longitudinal mode oscillation of the first longitudinal mode are possible by placing an active layer 840 between the position A 850 and the position D 880.

It is more effective to place the active layer 840 between the position A 850 and the position B 860. It is further effective if the active layer 840 is placed between the position A 850 and the position F 875. It is further effective if the active layer 840 is placed between the position G 885 and the position F 875.

Unlike the first embodiment, the suppression effect of the longitudinal mode is taken into consideration not only for the second longitudinal mode but also for the third longitudinal mode in the present embodiment.

Figure 9:
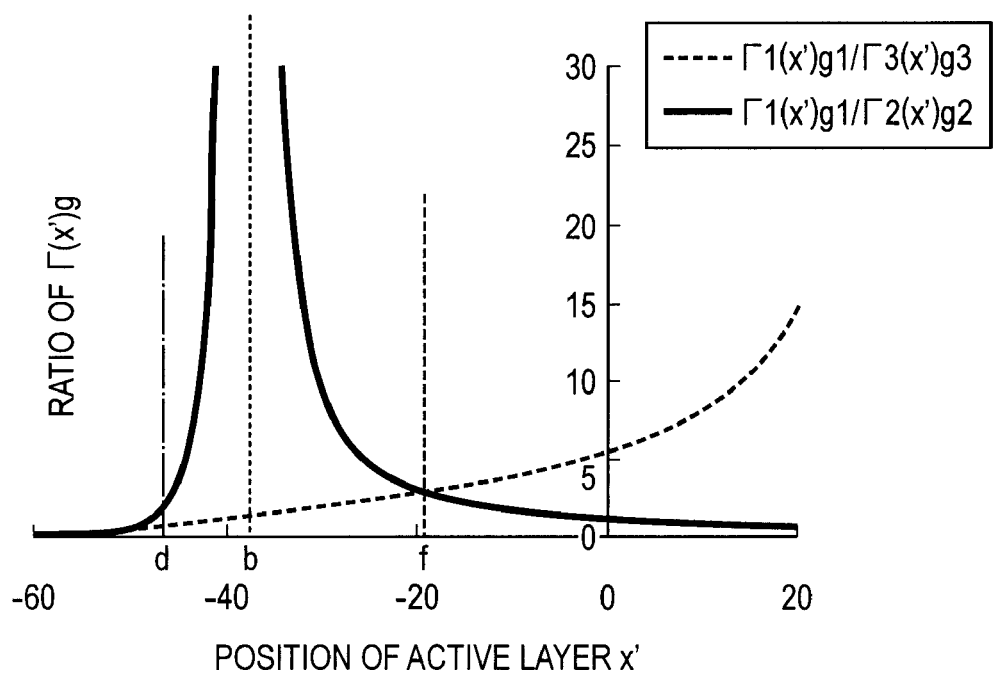
FIG. 9 is a diagram describing a relationship between the position of active layer x' and a ratio of $\Gamma(x')$ in the longitudinal modes of the surface-emitting laser according to the second embodiment of the present invention.

FIG. 9 illustrates a relationship between the position of x', Γ1(x')g1/Γ2(x')g2, and Γ1(x')g1/Γ3(x')g3.

The following specific values are used for λ1, Δλ, ΔλN, g(y), and N'. As values satisfying λ2>λ1, g1≠0, g2≠0, and g3≠0, λ1=780 nm, Δλ=−10 nm, ΔλN=15 nm, N'=10, and $$g(y)=6.70*10^{-8}y^5+1.95*10^{-6}y^4-5.56*10^{-5}y^3- 2.82*10^{-3}y^2+3.71=40^{-4}y+1$$

are used.

In this case, g1=0.78, g2=0.93, and g3=0.21 when λ2>λ1.

Under the condition, g2>g1 is satisfied.

A quintic function approximation is applied for the gain spectrum shape of wavelength 780 nm to obtain g(y) of Expression 8.

The oscillation of the second longitudinal mode 520 can be suppressed by placing the active layer 840 between the position A 850 and the position D 880, i.e. placing the active layer 840 at −47.8<x'<0 in FIG. 9.

In FIG. 9, Γ1(x')g1/Γ2(x')g2 is a monotonic increase from the position A to the position B and is a monotonic decrease from the position B 860 to the position D 880. Meanwhile, Γ1(x')g1/Γ3(x')g3 is a monotonic decrease from the position A 850 to the position D 860. Therefore, Γ1(x')g1/Γ2(x')g2 and Γ1(x')g1/Γ3(x')g3 may intersect at a position.

The position is a position F where the first longitudinal mode most stably oscillates the single longitudinal mode when both the second longitudinal mode and the third longitudinal mode are taken into consideration. More specifically, in this embodiment, in the position F 875, f=−19.5 nm.

Therefore, it is more effective between a position G 858 and the position F. In any range, Γ1g1>Γ2g2 and Γ1g1>Γ3g3, i.e. Expressions 6 and 7, need to be satisfied.

In the present embodiment, the lower limit of the range of x' is −42.4<x'≦0 in Expression 6. Therefore, the range of the position of active layer in the present embodiment is −42.4<x'≦0. The range is a shaded range 890 in FIG. 8.

The basic layer configuration is the same as in the first embodiment, and an example of configuration of a layer configuration of the surface-emitting laser according to the embodiment of the present invention will be described with reference to the cross-sectional schematic diagram of FIG. 3.

Figure 3:
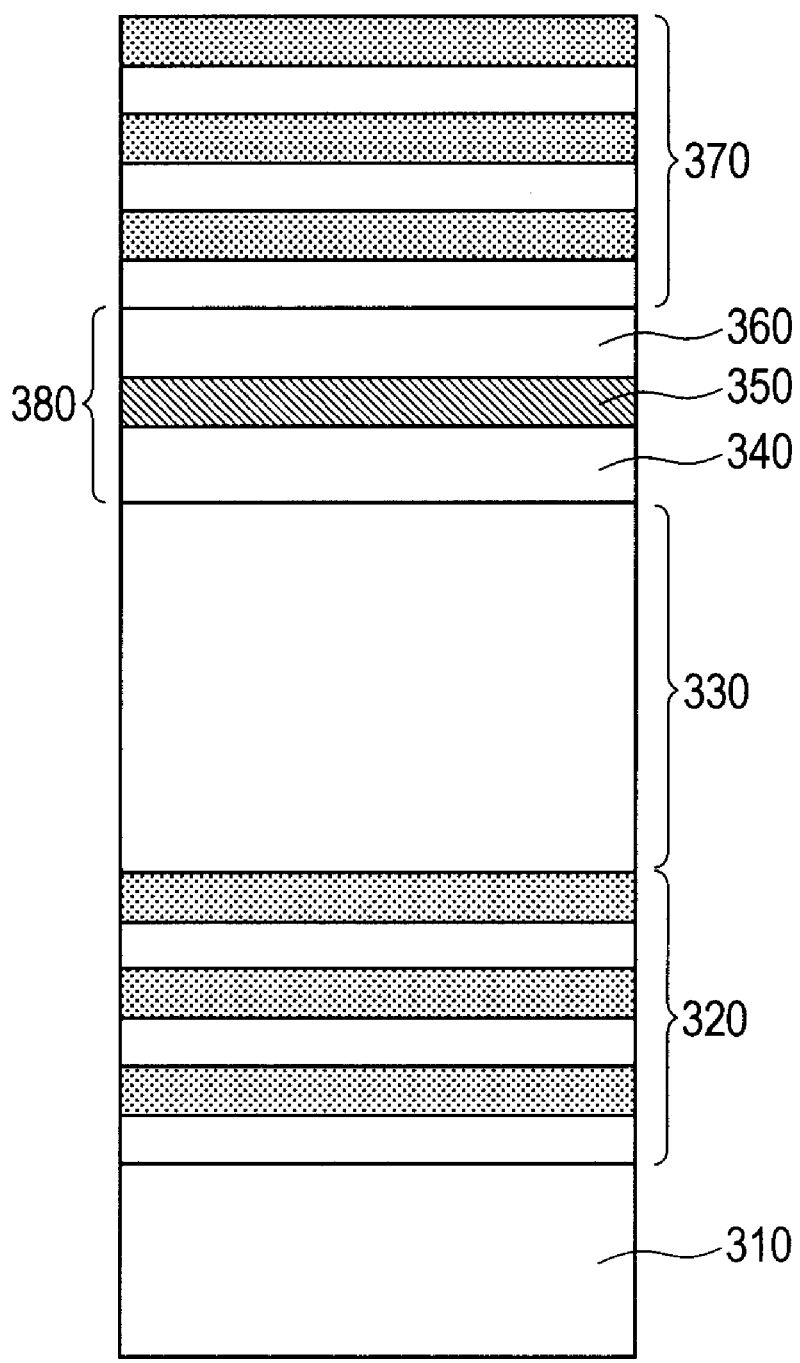
FIG. 3 is a schematic diagram describing a layer configuration of the surface-emitting laser according to the first embodiment of the present invention.

An infrared surface-emitting laser of wavelength 780 nm will be illustrated in relation to specific materials, layer configuration, and position of active layer of FIG. 3 satisfying the relationship.

On an n-type GaAs substrate 310, an n-type AlAs/$Al_{0.3}Ga_{0.7}As$ lower multilayer reflecting mirror 320, an n-type $Al_{0.3}Ga_{0.7}As$ layer spacer layer 330, an n-type $Al_{0.6}Ga_{0.7}As$ lower clad layer 340, an $Al_{0.12}Ga_{0.88}As$/$Al_{0.3}Ga_{0.7}As$ multi-quantum well active layer 350, a p-type $Al_{0.6}Ga_{0.7}As$ upper clad layer 360, and a p-type $Al_{0.3}Ga_{0.7}As$/$Al_{0.9}Ga_{0.1}As$ upper multilayer reflecting mirror 370 are laminated.

There are 40 pairs of the AlAs/$Al_{0.3}Ga_{0.7}As$ lower multilayer reflecting mirrors 320, 24 pairs of the $Al_{0.3}Ga_{0.7}As$/$Al_{0.9}Ga_{0.1}As$ upper multilayer reflecting mirrors 370, and three $Al_{0.12}Ga_{0.88}As$/$Al_{0.3}Ga_{0.7}As$ multi-quantum well active layers 350. The center of the middle quantum well of the three quantum wells is the position of the active layer.

For a specific example of the position of the active layer 840, the active layer 840 is placed at the position F 875 in the layer configuration, i.e. a position shifted by 19.5 nm from the position A 850 as a standing wave loop of the first longitudinal mode 810 in the direction opposite the substrate.

The layer configuration and the layer thickness in that case are as follows.

The $Al_{0.6}Ga_{0.7}As$ upper clad layer 360 has a thickness of 32.5 nm.

The active layer 350 includes, from the upper layer, $Al_{0.3}Ga_{0.7}As$ (42 nm)/$Al_{0.12}Ga_{0.88}As$ (8 nm)/$Al_{0.3}Ga_{0.7}As$ (10 nm)/$Al_{0.12}Ga_{0.88}As$ (8 nm)/$Al_{0.3}Ga_{0.7}As$ (10 nm)/$Al_{0.12}Ga_{0.88}As$ (8 nm)/$Al_{0.3}Ga_{0.7}As$ (42 nm), and the $Al_{0.6}Ga_{0.4}As$ lower clad layer 340 has a thickness of 71.5 nm. The position at 4 nm of the second $Al_{0.12}Ga_{0.88}As$ layer from the top of the active layer 840 is the position of active layer.

When the active layer 840 is placed at the position A 850 as a standing wave loop of the first longitudinal mode as a conventional embodiment, the $Al_{0.6}Ga_{0.7}As$ upper clad layer 360 and the $Al_{0.6}Ga_{0.4}As$ lower clad layer 340 of the layer configuration have a thickness of 52.0 nm. Since the active layer 840 is shifted by 19.5 nm from the position A in the direction opposite the substrate, the $Al_{0.6}Ga_{0.4}As$ upper clad layer 360 is 32.5 nm, and the $Al_{0.6}Ga_{0.4}As$ lower clad layer 340 is 71.5 nm.

An n-type $Al_{0.3}Ga_{0.7}As$ layer is used for the spacer layer 330, and the layer thickness is 4.06 μm.

The resonator length is 19λ when the effective reflecting mirror length is taken into consideration based on ΔλN=15 nm. Therefore, the lower clad layer 340, the active layer 350, and the upper clad layer 360 are 1λ, and the spacer layer 330 is 18λ.

By the way, N'=10 is determined from the effective reflecting mirror length, the upper clad layer 360, and the active layer 350.

The layer configuration satisfies Expression 8, λ1=780 nm, Δλ=−10 nm, ΔλN=15 nm, and N'=10. Therefore, the position of active layer 840 and the positions of FIG. 8 can be determined as follows.

At the position A 850, x'=0 nm, at the position B 860, b=−38.6 nm, at the position C 870, c=−59.1 nm, at the position D 880, d=−47.8 nm, at the position F 875, f=−19.5 nm, and at the position G 885, g=−9.7 nm.

As a result, the oscillation of the second longitudinal mode 520 can be suppressed by positioning the active layer at −47.8<x'<0 as described above in the configuration. Although the range satisfies Expressions 5 ad 7, the lower limit of the range of x' is −42.4<x'≦0 in Expression 6, and therefore the range of the position of active layer is −42.4<x'<0 in the present embodiment.

Expression 6 denotes a condition in which Γg of the first longitudinal mode becomes greater than Γg of the third longitudinal mode. In this case, g2>g1 is satisfied, and even if the gain of the second longitudinal mode is greater than the gain of the first longitudinal mode, the single longitudinal mode oscillation of the first longitudinal mode can be realized in the range satisfying Expressions 5, 6, and 7.

If the active layer 840 is placed at the position F 875 when both the second longitudinal mode and the third longitudinal mode are taken into consideration as in the present embodiment, the first longitudinal mode becomes stable, and the effect of the single longitudinal mode formation is maximized. Note that, although the active layer 840 is placed at the position F 875 in this embodiment, since the above effect is realized as long as the active layer is placed within the above range, the active layer 840 may be placed, for example, at a position between the position G 885 and the position F 875.

The formation method, the semiconductor materials, the electrode materials, and the dielectric materials are not limited to the ones disclosed in the embodiments, and other methods and materials can be used without departing from the scope of the present invention.

Although GaInP and AlGaAs are described as the light-emitting materials in the examples of the surface-emitting lasers of wavelength 680 nm and wavelength 780 nm in the two embodiments, the wavelengths and the materials are not limited to these. Light emitting materials such as AlGaInN, AlGaInP, AlGaInAsP, and AlGaAsSb may be used. Accordingly, appropriate materials may be used for the upper and lower multilayer reflecting mirrors, the upper and lower clad layers, and the spacer layers.

As described in the first embodiment, a periodic gain structure with two or more active layers may also be used in the present embodiment.

Third Embodiment

In a third embodiment, an example of applying a periodic gain structure using a plurality of active layers, instead of using one active layer as in the first area of the first embodiment, is described.

More specifically, a second active layer is placed in addition to the first active layer in the present embodiment. The first active layer and the second active layer are arranged in the first area.

Figure 10:
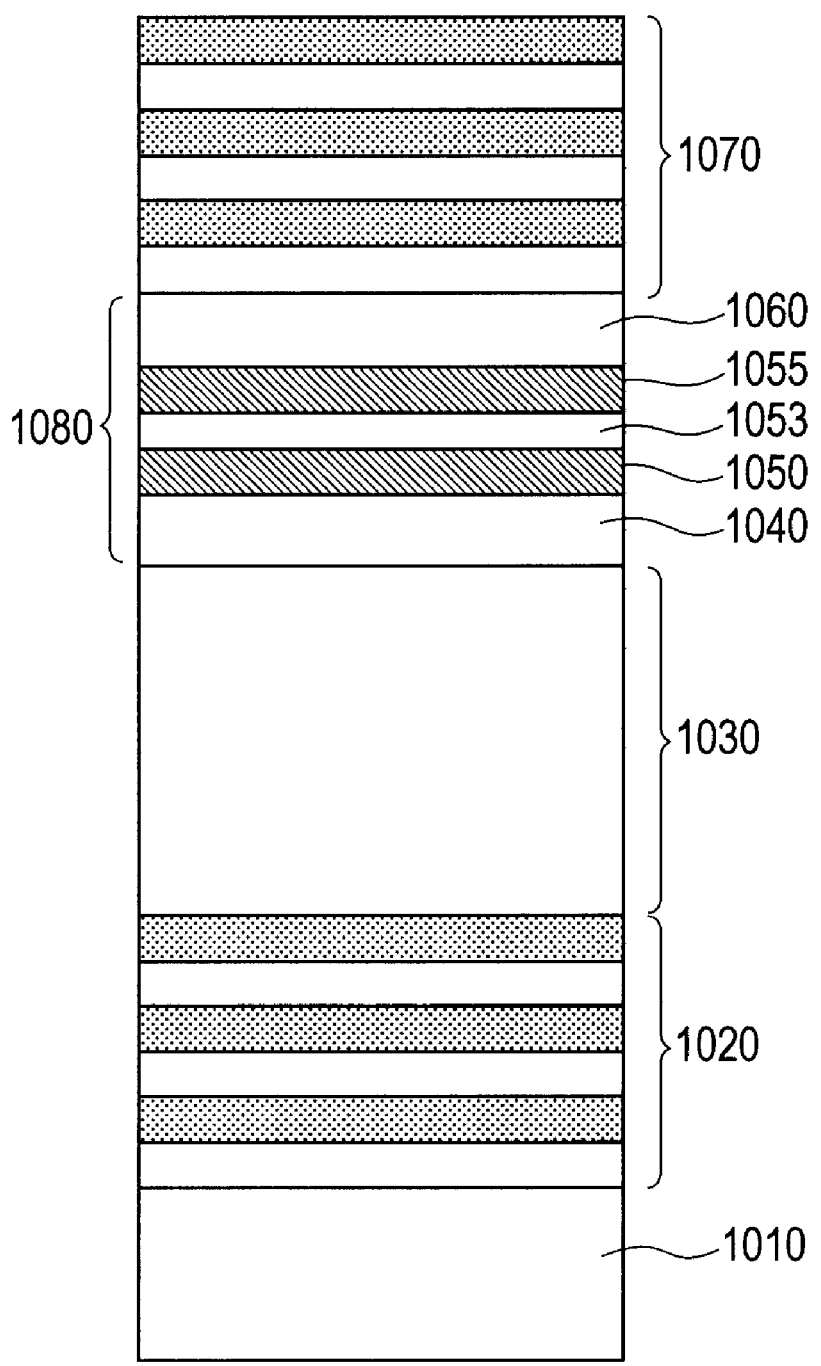
FIG. 10 is a schematic diagram describing a layer configuration of a surface-emitting laser according to a third embodiment of the present invention.

FIG. 10 illustrates a cross-sectional schematic diagram for describing a layer configuration of a surface-emitting laser according to the present embodiment. In FIG. 10, the first area is formed by a lower clad layer 1040, a lower active layer 1050, an inter-active-layer spacer layer 1053, an upper active layer 1055, and an upper clad layer 1060. The upper active layer 1055 serves as the first active layer, and the lower active layer 1050 serves as the second active layer.

In the upper active layer 1055, as in the first embodiment, the gain is g1 and the confinement factor is Γ1 at the resonant wavelength λ1, the gain is g2 and the confinement factor is λ2 at the resonant wavelength λ2, and the gain is g3 and the confinement factor is Γ3 at the resonant wavelength λ3. In this case, λ2<λ1 and g2>g3.

Meanwhile, in the lower active layer 1050, the gain is g'1 and the confinement factor is Γ1 at the resonant wavelength λ1, the gain is g'2 and the confinement factor is Γ2 at the resonant wavelength λ2, and the gain is g'3 and the confinement factor is Γ3 at the resonant wavelength λ3. In this case, g'2<g'3.

In relation to the upper active layer 1055, the difference between the resonant wavelength λ1 and the peak wavelength λg of gain spectrum is Δλ, and the function of the gain spectrum is g(y). On the other hand, in relation to the lower active layer 1050, the difference between the resonant wavelength λ1 and the peak wavelength λg' of gain spectrum is Δλ', and the function of the gain spectrum is g'(y).

The definitions of the gains and the longitudinal modes are as in the first embodiment, and "'" is added to reference characters to describe the lower active layer 1050.

As for the position of the active layer, the active layer center of the upper active layer 1055 is conventionally at an N'-th loop of the standing wave of the first longitudinal mode, and the active layer center of the lower active layer 1050 is conventionally at an (N'+1)-th loop of the standing wave of the first longitudinal mode.

In the present embodiment, λ2<λ1, g2>g3, and g'2<g'3 are satisfied. In this case g'2<g'3 indicates the same as g2>g3 when λ2>λ1 in the second embodiment.

Figure 11:
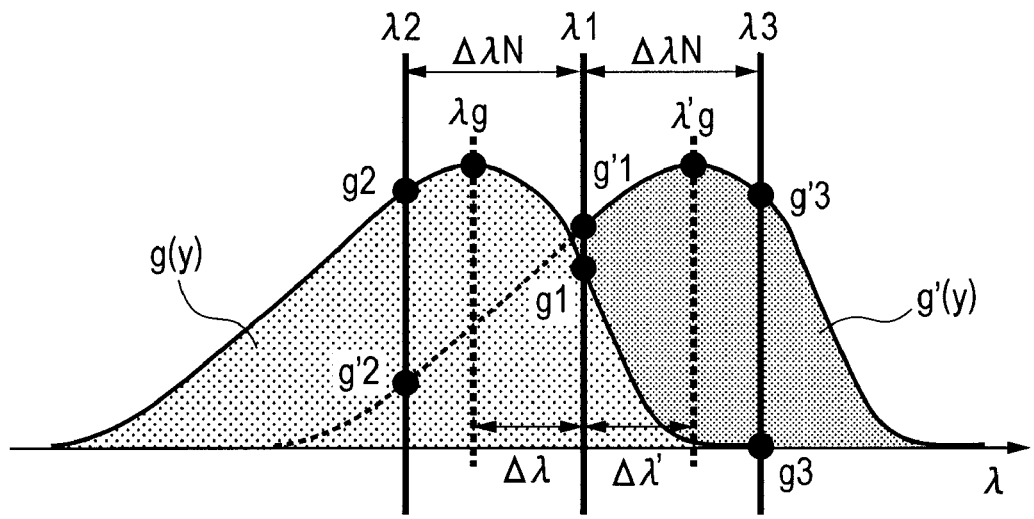
FIG. 11 is a diagram describing a relationship between longitudinal modes and a gain spectrum of the surface-emitting laser according to the third embodiment of the present invention.

FIG. 11 illustrates a relationship between longitudinal modes and a gain spectrum of a surface-emitting laser according to the present embodiment.

In relation to upper and lower active layers, a relationship diagram between the resonant wavelengths λ1, λ2, and λ3, the gains g1, g2, g3, g'1, g'2, and g'3, and Δλ, Δλ', ΔλN, g(y), and g'(y) is illustrated. In this case, λ2<λ1, g2>g3, g'2<g'3, g1≠0, g2≠0, g'1≠0, and g'3≠0.

In relation to the upper active layer, the suppression of the oscillation of the second longitudinal mode and the single longitudinal mode oscillation of the first longitudinal mode is enabled when the active layer is placed at a position satisfying Γ1(0)/Γ2(0)<Γ1(x')/Γ2(x'), Γ1g1>Γ2g2, and Γ1g1>Γ3g3.

Meanwhile, in relation to the lower active layer, the position satisfies Γ1'(0)/Γ3(0)<Γ1(x")/Γ3(x"), Γ1g'1>Γ2g'2, and Γ1g'1>Γ3g'3.

Γ1(x") is a function of a distance x" based on the position of the (N'+1)-th standing wave loop from the effective resonator edge of the upper multilayer reflecting mirror, provided that the substrate direction is positive. The position of the upper active layer satisfies Expressions 1, 2, and 3, and the position of the lower active layer satisfies Expressions 5, 6, and 7.

Figure 12:
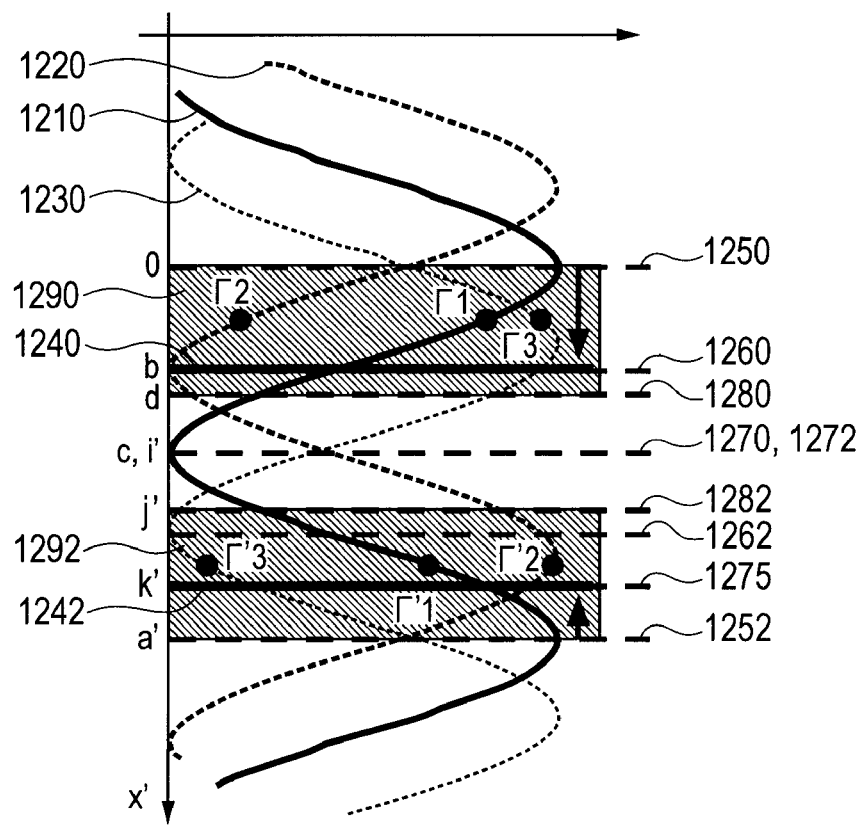
FIG. 12 is a diagram describing a relationship between an intensity distribution of standing waves of the longitudinal modes and a position of active layer of the surface-emitting laser according to the third embodiment of the present invention.
Figure 13:
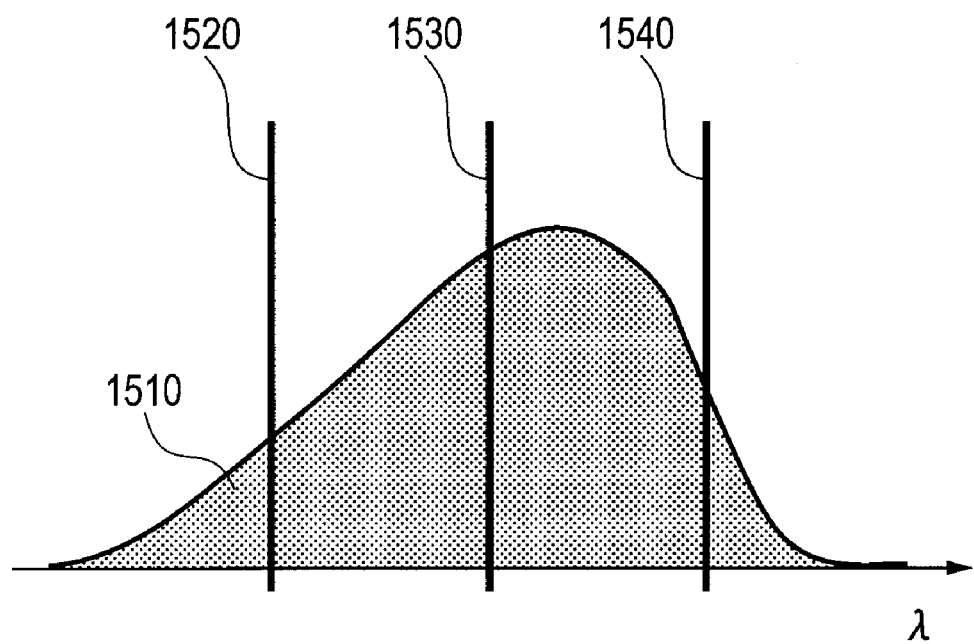
FIG. 13 is a diagram illustrating a relationship between longitudinal modes and a gain spectrum of a surface-emitting laser for describing problems of conventional techniques.

FIG. 12 illustrates an intensity distribution of standing waves of the longitudinal mode and the positions of the upper and lower active layers to describe ranges of the positions of the upper and lower active layers for enabling the effect of the present embodiment. The standing waves of a first longitudinal mode 1210 at a resonant wavelength λ1, a second longitudinal mode 1220 at a resonant wavelength λ2, and a third longitudinal mode 1230 at a resonant wavelength λ3 are illustrated.

In FIG. 12, a position A 1250 is at an N'-th standing wave loop of the first longitudinal mode 1210, and x'=0 is set to the position A. In FIG. 12, x' is at a position of the active layer when the direction of a substrate 1010 is a positive direction based on the position A.

A position A' 1252 is at an (N'+1)-th standing wave loop of the first longitudinal mode 1210, and x'=a' is set to the position A'.

The positions are determined as follows in accordance with the first and second embodiments.

In FIG. 12, a position C 1270 is at a node closest to a position B 1260 which is a node of the second longitudinal mode 1220 closest from the position A 1250 among the nodes of the standing wave of the first longitudinal mode 1210.

A position D 1280 is a position between the position A 1250 and the position C 1270 and in which Γ1/Γ2 is equal to Γ1/Γ2 at the position A 1250.

A shaded range 1290 of the position of the upper active layer 1240 is a range that is between the position A 1250 and the position D 1280 and that satisfies Γ1g1>Γ2g2 and Γ1g1>Γ3g3.

A position I' 1272 is at a node closest to a position H' 1262 that is a node of the third longitudinal mode 1230 closest from the position A' 1252 among the nodes of the standing wave of the first longitudinal mode 1210.

In FIG. 12, the position C 1270 and the position I' 1272 are the same.

A position J' 1282 is a position between the position A' 1252 and the position I' 1272 and in which Γ'1/Γ'3 is equal to Γ'1/Γ'3 at the position A' 1252.

A position K' 1275 is a position between the position A' and the position J' 1282 and in which Γ2g'2=Γ3g'3.

A range 1292 of a lower active layer position 1242 is a range that is between the position A' 1252 and the position J' and that satisfies Γ1g'1>Γ2g'2 and Γ1g'1>Γ3g'3.

When the layer configuration is determined and λ1, Δλ, Δλ', ΔλN, and N' are defined, the positions x' are determined as follows.

At the position A 1250, x'=0.

At the position B 1260, x'=b, and b is as in the following formula.

$$b = \frac{\lambda 1 - \Delta \lambda N}{2n} \times N' - \frac{\lambda 1}{2n} \times \left(N' - \frac{1}{2}\right)$$

At the position C 1270, x'=c and c=λ1/4n.

At the position D 1280, x'=d, and d satisfies the following formula.

$$\frac{\sin^2\left[\frac{2\pi}{(\lambda 1)}\left\{d + \left(N' - \frac{1}{2}\right) \times \frac{\lambda 1}{2n}\right\}\right]}{\sin^2\left[\frac{2\pi}{(\lambda 1 - \Delta \lambda N)}\left\{d + \left(N' - \frac{1}{2}\right) \times \frac{\lambda 1}{2n}\right\}\right]} =$$

$$\frac{\sin^2\left[\frac{2\pi}{(\lambda 1)}\left\{\left(N' - \frac{1}{2}\right) \times \frac{\lambda 1}{2n}\right\}\right]}{\sin^2\left[\frac{2\pi}{(\lambda 1 - \Delta \lambda N)}\left\{\left(N' - \frac{1}{2}\right) \times \frac{\lambda 1}{2n}\right\}\right]}$$

At the position A' 1252, x'=a' and a'=λ1/2n.

At the position H' 1262, x'=a'+h', and h' is as in the following formula.

$$h' = -\frac{\lambda 1 - \Delta \lambda N}{2n} \times (N'+1) + \frac{\lambda 1}{2n} \times \left(N' + \frac{1}{2}\right)$$

At the position I' 1272, x'=a'+i' and i'=λ1/4n.

At the position J' 1282, a'+j', and j' satisfies the following expression.

$$\frac{\sin^2\left[\frac{2\pi}{(\lambda 1)}\left\{j' + \left(N' + \frac{1}{2}\right) \times \frac{\lambda 1}{2n}\right\}\right]}{\sin^2\left[\frac{2\pi}{(\lambda 1 - \Delta \lambda N)}\left\{j' + \left(N' + \frac{1}{2}\right) \times \frac{\lambda 1}{2n}\right\}\right]} =$$

$$\frac{\sin^2\left[\frac{2\pi}{(\lambda 1)}\left\{\left(N' + \frac{1}{2}\right) \times \frac{\lambda 1}{2n}\right\}\right]}{\sin^2\left[\frac{2\pi}{(\lambda 1 + \Delta \lambda N)}\left\{\left(N' + \frac{1}{2}\right) \times \frac{\lambda 1}{2n}\right\}\right]}$$

At the position K' 1275, x+k', and k' satisfies the following expression.

$$\frac{\Gamma'3}{\Gamma'2} = \frac{\sin^2\left[\frac{2\pi}{(\lambda 1 + \Delta \lambda N)}\left\{k' + \left(N' + \frac{1}{2}\right) \times \frac{\lambda 1}{2n}\right\}\right]}{\sin^2\left[\frac{2\pi}{(\lambda 1 - \Delta \lambda N)}\left\{k' + \left(N' + \frac{1}{2}\right) \times \frac{\lambda 1}{2n}\right\}\right]} = \frac{g(\Delta \lambda' - \Delta \lambda N)}{g(\Delta \lambda' + \Delta \lambda N)} = \frac{g'2}{g'3}$$

The following specific values of λ1, Δλ, Δλ', ΔλN, g(y), g'(y), and N' are for a structure satisfying g2>g3 and g'2<g'3.

Expression 4 is used with λ1=680 nm, Δλ=5 nm, Δλ'=−5 nm, ΔλN=15 nm, N'=14, and g(y)=g'(y).

$$g(y) = -1.82 \times 10^{-4} y^4 - 5.70 \times 10^{-4} y^3 - 7.88 \times 10^{-3} y^2 + 9.52 \times 10^{-4} y + 1$$ [Expression 4]

In this case, g2>g3 and g'2<g'3, and g1=0.73, g2=0.86, g3=0, g'1=0.86, g'2=0.22, and g'3=0.73. In the configuration, the oscillation of the second longitudinal mode of the active layers can be suppressed by positioning the upper active layer 1240 at 0<x'<33.1 and positioning the lower active layer 1242 at 63.5<x'<103.0.

Since the range satisfies Γ1g1>Γ2g2, Γ1g1>Γ3g3, Γ1g'1>Γ2g'2, and Γ1g'1>Γ3g'3, the single longitudinal mode oscillation of the first longitudinal mode can be realized.

Specific materials, layer configuration, position of active layer of FIG. 10 satisfying the relationship will be illustrated for a red surface-emitting laser of wavelength 680 nm. A periodic gain structure with two active layers is used, and a multi-quantum well structure is used for the active layers.

The layer configuration is similar to the layer configuration in the first embodiment. Therefore, the lower multilayer reflecting mirror 1020, the upper multilayer reflecting mirror 1070, and the first area 1080 will not be described. Only the spacer layer 1030, the lower clad layer 1040, the lower active layer 1050, the inter-active-layer spacer layer 1053, the upper active layer 1055, and the upper clad layer 1060 will be described.

The layers include an n-type $Al_{0.5}Ga_{0.5}As$ layer spacer layer 1030, an n-type AlGaInP lower clad layer 1040, a $Ga_{0.38}In_{0.62}P/Al_{0.25}Ga_{0.25}In_{0.5}P$ lower multi-quantum well active layer 1050, an undoped AlGaInP inter-active-layer spacer layer 1053, a $Ga_{0.43}In_{0.57}P/Al_{0.25}Ga_{0.25}In_{0.5}P$ upper multi-quantum well active layer 1055, and a p-type AlGaInP upper clad layer 1060.

The upper multi-quantum well active layer 1055 and the lower multi-quantum well active layer 1050 include three quantum wells. The centers of the middle quantum well of the three quantum wells are the positions of the active layers.

As for a specific example of the position of the upper active layer 1240 and the position of the lower active layer 1242, the upper active layer 1240 is placed at the position B 1260 in the layer configuration, i.e. position shifted by 30.3 nm from the position A 1250 as an N'-th standing wave loop of the first longitudinal mode 1210 toward the substrate.

Meanwhile, the lower active layer 1242 is placed at the position K' 1275, i.e. a position shifted by 11.8 nm from the position A' 1252 which is an (N'+1)th standing wave loop of the first longitudinal mode 1210 in the direction opposite the substrate.

The layer configuration and the layer thickness are as follows.

The AlGaInP upper clad layer 1060 has a thickness of 76.1 nm, the upper active layer 1055 is, from the upper layer, AlGaInP (42 nm)/$Ga_{0.43}In_{0.57}P$ (6.5 nm)/AlGaInP (5.5 nm)/$Ga_{0.43}In_{0.57}P$ (6.5 nm)/AlGaInP (5.5 nm)/$Ga_{0.43}In_{0.57}P$ (6.5 nm)/AlGaInP (5.5 nm)/$Ga_{0.43}In_{0.57}P$ (6.5 nm), the AlGaInP inter-active-layer spacer layer 1053 has a thickness of 30.4 nm, the lower active layer 1050 is, from the upper layer, $Ga_{0.38}In_{0.62}P$ (6.5 nm)/AlGaInP (5.5 nm)/$Ga_{0.38}In_{0.62}P$ (6.5 nm)/AlGaInP (5.5 nm)/$Ga_{0.38}In_{0.62}P$ (6.5 nm)/AlGaInP (42 nm), and the AlGaInP lower clad layer 1040 has a thickness of 57.6 nm.

As usual, when the active layer 1240 is placed at the position A of the N'-th standing wave loop of the first longitudinal mode, the AlGaInP upper clad layer 1060 and the AlGaInP lower clad layer 1040 of the layer configuration have a thickness of 45.8 nm.

The upper active layer 1240 is shifted by 30.3 nm from the position A 1250 toward the substrate, and the lower active layer 1242 is shifted by 11.8 nm from the position A' 1252 toward the direction opposite the substrate.

Therefore, the AlGaInP upper clad layer 1060 is 76.1 nm, the AlGaInP lower clad layer 1040 is 57.6 nm, and the AlGaInP inter-active-layer spacer layer 1053 is 30.4 nm.

An n-type $Al_{0.5}Ga_{0.5}As$ layer is used for the spacer layer 1030, and the layer thickness is 4.06 µm.

In this case, the resonator length is 22λ when the effective reflecting mirror length is taken into consideration from ΔλN=10 nm. Therefore, the total thickness from the upper clad layer 1060 to the center of the upper active layer 1055 is 0.5λ, and the total thickness from the center of the upper active layer 1055 to the center of the lower active layer 1050 is 0.5λ.

The total thickness from the center of the lower active layer 1050 to the lower clad layer is 0.5λ, and the spacer layer 1030 is 20.5λ.

In this embodiment, N'=10 is determined from the effective reflecting mirror length, the upper clad layer 1060, and the upper active layer 1055.

Based on the layer configuration, the upper active layer position 1240 and the lower active layer position 1242 that satisfy the positions and conditions of FIG. 12 can be determined as follows.

At the position A 1250, x'=0 nm.
At the position B 1260, b=30.3 nm.
At the position C 1270, c=51.5 nm.
At the position D 1280, d=33.1 nm.
At the position A' 1252, x'=a'=103.0 nm.
At the position H' 1262, h'=−30.3 nm, x'=a'+h'=72.7 nm.
At the position I' 1272, i'=−51.5 nm, x'=a'+=51.5 nm.
At the position J' 1282, j'=−39.5 nm, x'=a'+j'=63.5 nm.
At the position K' 1275, k'=−11.8 nm, x'=a'+k'=91.2 nm.

In the configuration, the oscillation of the second longitudinal mode of the active layers can be suppressed by positioning the upper active layer 1240 at 0<x'<33.1 and positioning the lower active layer 1242 at 63.5<x'<103.0, as described above. Since Γ1g1>Γ2g2, Γ1g1>Γ3g3, Γ'1g'1>Γ'2g'2, and Γ'1g'1>Γ'3g'3 are satisfied within the range, the single longitudinal mode oscillation of the first longitudinal mode can be realized.

While in this embodiment the upper active layer 1240 is placed at the position B 1260, and the lower active layer 1242 is placed at the position K', the positions of the active layers are not limited to these, and the active layers may be placed at arbitrary positions within the range.

The active layers can suppress the longitudinal modes adjacent to the first longitudinal mode by providing two active layers and shifting the peak wavelength of the gain spectrum to satisfy g2>g3 and g'2<g'3. Therefore, a more stable single longitudinal mode can be realized.

As can be understood from FIG. 11, for example, when the gain spectrum changes to a short wavelength or a long wavelength due to a temperature change, the range where a large gain of the first longitudinal mode can be obtained, relative to the temperature change, is wider than when there is one active layer. However, if this is performed without shifting the position of active layer, longitudinal modes other than the first longitudinal mode would also be oscillated. On the other hand, shifting the position of active layer by the method allows suppressing the oscillation except the oscillation of the first longitudinal mode and allows enlarging the range capable of obtaining a large gain of the first longitudinal mode.

Although the case of λ2<λ1, g2>g3, and g'2<g'3 in the periodic gain structure has been described, λ2>λ1, g2>g3, and g'2<g'3 are also possible. In that case, the upper active layer is shifted in the direction opposite the substrate direction, and the lower active layer is shifted in the substrate direction.

Appropriate values can be used for Δλ, Δλ', and the amounts of shift of active layers.

Although the structure in the first area of the present embodiment is a little different from the first embodiment, the fabrication method of surface-emitting laser and the basic layer configuration are the same as in the first embodiment. Therefore, the description concerning the fabrication method, the substrate, and the electrode, for example, is omitted.

The formation methods, the semiconductor materials, the electrode materials, and the dielectric materials of the present invention are not limited to the ones disclosed in the embodiments, and other methods and materials can be used without departing from the scope of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-246317, filed Nov. 2, 2010, which is hereby incorporated by reference herein in its entirety.

What is claimed is:
1. A vertical cavity surface emitting laser that includes a plurality of semiconductor layers laminated on a substrate, the layers including a lower multilayer reflecting mirror, an upper multilayer reflecting mirror, and a first active layer arranged between the mirrors, and that oscillates at a wavelength λ1, wherein a resonator is formed by the upper multilayer reflecting mirror and the lower multilayer reflecting mirror, the resonator has a structure that generates longitudinal multimode including:

a first longitudinal mode in which a resonant wavelength is $\lambda 1$, and in which a confinement factor of the first active layer is $\Gamma 1$ and a gain at the resonant wavelength $\lambda 1$ in a gain spectrum originated from the first active layer is g1 (g1≠0);

a second longitudinal mode in which the resonant wavelength is $\lambda 2$ and which is adjacent to the first longitudinal mode, and in which the confinement factor is $\Gamma 2$ and the gain at the resonant wavelength $\lambda 2$ is g2 (g2≠0); and a third longitudinal mode that is different from the second longitudinal mode in which the resonant wavelength is $\lambda 3$ and which is adjacent to the first longitudinal mode, and in which the confinement factor is $\Gamma 3$ and the gain at the resonant wavelength $\lambda 3$ is g3 (g2>g3), and the first active layer is arranged at a position shifted from a standing wave loop of the first longitudinal mode formed in the resonator, oscillation of the second longitudinal mode with a large gain of the first active layer among the first to third longitudinal modes is suppressed, and single longitudinal mode oscillation based on the first longitudinal mode is allowed.

2. The vertical cavity surface emitting laser according to claim 1, wherein a resonator length of the resonator is $6\lambda$ or more.

3. The vertical cavity surface emitting laser according to claim 1, wherein a position of the first active layer is between a position A that is a standing wave loop of the first longitudinal mode and a position D that is a position where $\Gamma 1/\Gamma 2$ is equal to $\Gamma 1/\Gamma 2$ at the position A, in which the distance from the position D to the position A is shorter than the distance from a position C to the position A, in which the position C is at a node closest to a position B, which is at a node of the second longitudinal mode closest from the position A, among the nodes of the standing wave of the first longitudinal mode, and satisfying $\Gamma 1g1 > \Gamma 2g2$ and $\Gamma 1g1 > \Gamma 3g3$.

4. The vertical cavity surface emitting laser according to claim 3, wherein the first active layer is arranged at a position between the position A and the position B.

5. The vertical cavity surface emitting laser according to claim 3, wherein the first active layer is arranged at a position between a position E which is a center position between the position A and the position B, and the position B.

6. The vertical cavity surface emitting laser according to claim 3, wherein the first active layer is arranged at a position between the position A and a position F which is a position between the position A and the position B and in which $\Gamma 2g2 = \Gamma 3g3$.

7. The vertical cavity surface emitting laser according to claim 3, wherein the first active layer is arranged at a position between a position G which is a center position between the position A and a position F which is a position between the position A and the position B and in which $\Gamma 2g2 = \Gamma 3g3$, and the position F.

8. The vertical cavity surface emitting laser according to claim 1, wherein a relationship between the gain g1 and the gain g2 in the first active layer satisfies a relationship of g2>g1.

9. The vertical cavity surface emitting laser according to claim 1, wherein a relationship between the resonant wavelength $\lambda 2$ and the resonant wavelength $\lambda 1$ satisfies a relationship of $\lambda 2 < \lambda 1$.

10. The vertical cavity surface emitting laser according to claim 1, wherein the relationship between the resonant wavelength $\lambda 2$ and the resonant wavelength $\lambda 1$ satisfies a relationship of $\lambda 2 > \lambda 1$.

11. The vertical cavity surface emitting laser according to claim 1, wherein other than the first active layer, a plurality of semiconductor layers including a second active layer are laminated between the lower multilayer reflecting mirror and the upper multilayer reflecting mirror.

12. The vertical cavity surface emitting laser according to claim 11, wherein the second active layer has a gain g'1 and a confinement factor $\Gamma'1$ in the first longitudinal mode, a gain g'2 and a confinement factor $\Gamma'2$ in the second longitudinal mode, and a gain g'3 and a confinement factor $\Gamma'3$ in the third longitudinal mode, and a relationship of g'2<g'3 is satisfied.

13. The vertical cavity surface emitting laser according to claim 12, wherein the position of the second active layer is between a position A' that is a position of a standing wave loop of the first longitudinal mode formed in the resonator and a position J' that is a position in which $\Gamma'1/\Gamma'3$ is equal to $\Gamma'1/\Gamma'3$ of the position A', in which the distance from the position J' to the position A is shorter than the distance from a position I' to the position A', in which the position I' is a position of a node relative to the standing wave loop of the first longitudinal mode closest to a position H' that is a position of a node of the third longitudinal mode closest from the position A', and satisfying $\Gamma'1g'1 > \Gamma'2g'2$ and $\Gamma'1g'1 > \Gamma'3g'3$.

14. The vertical cavity surface emitting laser according to claim 1, wherein when a structure in which the resonant wavelength $\lambda 1$, an amount of detuning $\Delta\lambda$ that is a difference between the resonant wavelength $\lambda 1$ and a peak wavelength $\lambda g$ of a gain spectrum determined by the active layer, a resonator length $M \times \lambda 1$ of the resonator, a longitudinal mode spacing $\Delta\lambda N$ determined by the resonator length, the resonant wavelength $\lambda 1$, and an effective refractive index n, and a function g(y) of the gain spectrum determined by the first active layer are determined is adopted, if x is a distance from an effective resonator edge of the upper multilayer reflecting mirror, and if x' is a distance shifting the first active layer from an N'-th node of a standing wave of the first longitudinal mode from the effective resonator edge of the upper multilayer reflecting mirror, the first active layer is arranged in a range of x satisfying the following Expressions 1, 2, and 3 based on $\lambda 1(0)/\lambda 2(0) < \Gamma 1(x')/\lambda 2(x')$ and $\lambda 1g1 > \lambda 2g2$, $\Gamma 1g1 > \Gamma 3g3$:

$$\frac{g1}{g2} = \frac{g(\Delta\lambda)}{g(\Delta\lambda - \Delta\lambda N)} > \frac{\sin^2\left(\frac{2\pi}{(\lambda 1 - \Delta\lambda N)}x\right)}{\sin^2\left(\frac{2\pi}{\lambda 1}x\right)} = \frac{\Gamma 2}{\Gamma 1} \quad \text{[Expression 1]}$$

$$\frac{g1}{g3} = \frac{g(\Delta\lambda)}{g(\Delta\lambda + \Delta\lambda N)} > \frac{\sin^2\left(\frac{2\pi}{(\lambda 1 + \Delta\lambda N)}x\right)}{\sin^2\left(\frac{2\pi}{\lambda 1}x\right)} = \frac{\Gamma 3}{\Gamma 1} \quad \text{[Expression 2]}$$

$$\frac{\Gamma 1(0)}{\Gamma 2(0)} = \frac{\sin^2\left[\frac{2\pi}{(\lambda 1)}\left\{\left(N' - \frac{1}{2}\right) \times \frac{\lambda 1}{2n}\right\}\right]}{\sin^2\left[\frac{2\pi}{(\lambda 1 - \Delta\lambda N)}\left\{\left(N' - \frac{1}{2}\right) \times \frac{\lambda 1}{2n}\right\}\right]} < \quad \text{[Expression 3]}$$

$$\frac{\sin^2\left[\frac{2\pi}{(\lambda 1)}\left\{x' + \left(N' - \frac{1}{2}\right) \times \frac{\lambda 1}{2n}\right\}\right]}{\sin^2\left[\frac{2\pi}{(\lambda 1 - \Delta\lambda N)}\left\{x' + \left(N' - \frac{1}{2}\right) \times \frac{\lambda 1}{2n}\right\}\right]} = \frac{\Gamma 1(x')}{\Gamma 2(x')}.$$

15. An image forming apparatus comprising:
a vertical activity surface emitting laser according to claim 1; and
a light deflector that reflects a laser beam output from the vertical cavity surface emitting laser for scanning.

* * * * *